(12) United States Patent
Arimoto et al.

(10) Patent No.: US 6,744,684 B2
(45) Date of Patent: Jun. 1, 2004

(54) SEMICONDUCTOR MEMORY DEVICE WITH SIMPLE REFRESH CONTROL

(75) Inventors: Kazutami Arimoto, Hyogo (JP); Hiroki Shimano, Hyogo (JP)

(73) Assignee: Reneses Technology Corp., Tokyo (JP)

( * ) Notice: Subject to any disclaimer, the term of this patent is extended or adjusted under 35 U.S.C. 154(b) by 115 days.

(21) Appl. No.: 09/777,694

(22) Filed: Feb. 7, 2001

(65) Prior Publication Data

US 2002/0159318 A1 Oct. 31, 2002

(30) Foreign Application Priority Data

Apr. 14, 2000 (JP) .................................... 2000-113097
Sep. 14, 2000 (JP) .................................... 2000-279456

(51) Int. Cl.$^7$ .............................................. G11C 7/00
(52) U.S. Cl. ................ 365/222; 365/233; 365/185.25; 365/230.01; 365/189.01
(58) Field of Search ............................ 365/222, 233, 365/185.25, 230.01, 189.01, 203

(56) References Cited

U.S. PATENT DOCUMENTS

| | | | | |
|---|---|---|---|---|
| 4,716,551 A | * | 12/1987 | Inagaki ...................... | 365/222 |
| 5,600,605 A | * | 2/1997 | Schaefer .................... | 365/233 |
| 5,862,093 A | * | 1/1999 | Sakakibara ................ | 365/222 |
| 6,219,292 B1 | * | 4/2001 | Jang ........................... | 365/222 |
| 6,438,055 B1 | * | 8/2002 | Taguchi et al. ............ | 365/222 |

FOREIGN PATENT DOCUMENTS

JP  7-192461  7/1995

OTHER PUBLICATIONS

"A 90–MHz 16–Mb System Integrated Memory with Direct Interface to CPU," by Dosaka et al., IEICE Trans. Electron., vol. E79–C, No. 7 (Jul. 1996), pp. 948–955.
"A 4–Mb Pseudo SRAM Operating at 2.6±1V with 3–μA Data Retention Current," by Sato et al., IEEE Journal of Solid–State Circuits, vol. 26, No. 11 (Nov. 1991), pp. 1556–1561.

* cited by examiner

Primary Examiner—Connie C. Yoha
(74) Attorney, Agent, or Firm—McDermott, Will & Emery

(57) ABSTRACT

A self refresh timer is set constantly to an operation state to render a refresh request signal FAY active periodically. When contention occurs between the refresh request signal FAY and an externally applied read or write command, a row selection related circuit/command generation related circuit controls a row related control signal so that a refresh operation is carried out after, for example, the read or write operation ends. A submemory array SMA is divided more small than that of the conventional case, and the refresh cycle ends in a shorter period of time. Therefore, a read operation and a refresh operation can be completed within a read cycle time. A DRAM core that can be employed with control as simple as that of an SRAM can be realized.

12 Claims, 29 Drawing Sheets

SEMICONDUCTOR MEMORY DEVICE WITH SIMPLE REFRESH CONTROL

BACKGROUND OF THE INVENTION

1. Field of the Invention

The present invention relates to a semiconductor memory device, particularly to a dynamic random access memory (DRAM) with simplified refresh control.

2. Description of the Background Art

System LSIs such as a logic-embedded DRAM having the logic of a processor, an ASIC (Application Specific IC) or the like and a dynamic random access memory (DRAM) of a large capacity integrated on the same semiconductor chip (semiconductor substrate) have now been used this few years.

By the interconnection between the logic and the DRAM through a multibit internal data bus of 128 to 512 bits in a system LSI, data transfer at least one or two order of magnitude faster than the case where a general DRAM with few terminals and a logic LSI are connected and used on a printed circuit board can be realized Also, the number of external pin terminals of the logic can be reduced than those of the system in which a general DRAM is externally provided with respect to the logic.

In a system LSI, the DRAM block and the logic are connected by internal wiring. Since the length of the internal wiring is sufficiently shorter than that on the print substrate so that parasitic capacitance is small, the discharge/charge current of the data bus can be reduced significantly and the signal can be transferred speedily.

By virtue of such factors, the DRAM-embedded system LSI greatly contributes to improving the performance of information equipment that carries out a process handling a great amount of data such as the three-dimensional graphic processing, image and video processing, or the like.

FIG. 34 schematically shows a structure of a DRAM circuit block incorporated in a conventional system LSI.

Referring to FIG. 34, the DRAM circuit block includes plurality of memory arrays MA0–MAn, sense amplifier bands SB1–SBn arranged between memory arrays MA1–MAn, and sense amplifier bands SB0 and SBn+1 arranged outside memory arrays MA0 and MAn. Each of memory arrays MA0–MAn is divided into a plurality of memory subarrays MSA by a subword driver band SWDB.

In each of memory arrays MA0–MAn, a main word line MWL is arranged common to divided memory subarrays MSA divided by subword driver band SWDB. Main word line MWL is arranged corresponding to a predetermined number of subword lines, respectively, of each memory subarray MSA of the corresponding memory array. Main word line MWL and a predetermined number of subdecode lines SDL arranged on the sense amplifier band are connected to a subword driver in subword driver band SWDB to select one subword line.

Each of sense amplifier bands SB1–SBn is shared by adjacent memory arrays. Corresponding to memory arrays MA0–MAn are provided a row decoder to select a main word line and a subdecode line according to a row address signal, and a column decoder in alignment with the row decoder to transmit on a column select line CSL a column select signal to select a column from a memory array according to a column address signal.

Column select line CSL is arranged at the sense amplifier band to connect a predetermined number of sense amplifier circuits to a group of internal data line pairs GIOP when selected. A predetermined number of internal data line pairs GIOP are arranged extending over memory arrays MA0–MAn to be coupled to a sense amplifier circuit selected via a local data line.

Internal data line pair GIOP is coupled to a data path band DPB provided in 128 bits to 512 bits, including a preamplifier and a write driver. In this data path band DPB, a preamplifier and a write driver are arranged corresponding to respective internal data line pairs GIOP. Internal data line pair GIOP may be a transmission line pair that transmits both write and read data, or provided as an internal data line pair in which a bus line pair transmitting read data and a write data line pair transmitting write data are provided individually.

The DRAM circuit block further includes a row address input circuit/refresh counter RAFK and a column address input circuit CAK receiving, for example, 13-bit external addresses A0–A12 from the logic, a command decoder/control circuit CDC receiving external control signals CLK, CKE, ICS, /RAS, /CAS, /WE and DM applied from the logic, and a data input/output control circuit DIOK to transfer data between data path band DPB and the logic.

Command decoder/control circuit CDC receives a clock signal CLK, a clock enable signal CKE, a row address strobe signal IRAS, a column address strobe signal /CAS, a write enable signal /WE and a data mask signal DM to determine the specified operation mode according to the logic status at the rising edge of these control signals. In this case, "command" is specified by the combination of the logic states at the rising edge of a clock signal CLK of these plurality of control signals CKE, /RAS, /CAS and /WE.

Data mask signal DM designates a write mask in byte-by-byte with respect to the data applied to data input/output control circuit DIOK. Command decoder/control circuit CDC decodes the command applied from the logic. An operation mode designation signal designating the operation mode specified by this command is generated, whereby various internal control signals to carry out the specified operation mode is generated.

The command includes a row active command to set the row to a selected state, a read command designating data reading, a write command designating data writing, a precharge command to return the selected row to a non-selected state, an auto refresh command to carry out a refresh operation, a self refresh command to carry out self refresh, and the like.

Row address input circuit/refresh counter RAFK responds to application of a row active command to receive external address bits A0–A12 as the row address to generate an internal row address signal under control of command decoder/control circuit CDC.

Row address input circuit/refresh counter RAFK includes an address buffer to apply a buffer process on an applied address bit, and an address latch latching the output signal of the buffer circuit.

The refresh counter included in row address input circuit/refresh counter RAFK generates a refresh address designating the row to be refreshed when an auto refresh command or a self refresh command is applied. When the refresh operation is completed, the count value of this refresh counter is incremented or decremented.

Column address input circuit CAK responds to the application of a read command or write command to receive the bits of lower significance of the external address bits such as address bits A0–A4 to generate an internal column address signal under control of command decoder/control circuit CDC. This column address input circuit CAK includes an address buffer and an address latch.

The internal row address signal from row address input circuit/refresh counter RAFK is applied to a row predecoder RPD. The internal column address signal from column address input circuit CAK is applied to column predecoder CPD.

Row predecoder RPD predecodes the applied internal row address signal to provide the predecoded signal to the row decoder in row/column decoder band RCDB. Column predecoder CPD predecodes the internal column address signal from column address input circuit CAK to provide the predecoded signal to the column decoder in row/column decoder band RCDB.

Upon receiving a read command or a write command, command decoder/control circuit CDC generates an internal control signal to control the operation of the preamplifier and the write driver in data input/output control circuit DIOK and data path band DPB. Clock signal CLK is used as a reference signal determining the internal operation timing of the DRAM circuit block.

Data input/output control circuit DIOK inputs/outputs data in synchronization with clock signal CLK. The row address input circuit of row address input circuit/refresh counter RAFK and column address input circuit CAK receive and latch the applied address bit in synchronization with clock signal CLK.

The DRAM circuit block further includes a block PHK which has an internal voltage generation circuit generating internal voltages VPP, VCCS, VCCP, VBL and a self refresh timer rendering a refresh request signal FAY active at a predetermined interval when a self refresh mode is specified, i.e. when command COM applied from command decoder/control circuit CDC is a self refresh command.

Internal voltage VPP is transmitted on a selected subword line SWL, and has a voltage level generally higher than the operating power supply voltage. Voltage VCCS is the operating power supply voltage of the sense amplifier circuit in sense amplifier bands SB0~SBn+1, generated by an internal voltage-down converter circuit not shown. Voltage VCCP is a periphery power supply voltage generated by an internal voltage-down converter circuit not shown, and the operating power supply voltage applied to the peripheral circuits such as the row decoder and column decoder in row/column decoder group RCDB and the preamplifier and write driver included in data path band DPB. Voltage VBL is a bit line precharge voltage. Voltage VCP is a cell plate voltage applied to the cell plate of a memory cell, taking a middle voltage between the H level voltage and the L level voltage of the memory cell data. Voltages VBL and VCP are middle voltages corresponding to ½ the array power supply voltage (sense power supply voltage).

The self refresh timer in the block PHK is rendered active upon entering a self refresh mode, and issues a refresh request signal FAY at a predetermined interval so that the refresh operations of all the rows in memory arrays MA0–MAn is completed once at the maximum refresh time tREFmax.

This self refresh mode is set generally when in a sleep mode, i.e. when the system LSI is at a standby state for over a long period of time. The charge stored in the capacitor in the memory cell is lost by various leakage current, for example, junction leakage current at a storage node SN, the channel leakage current of the memory cell transistor, the leakage current of the capacitor insulation film, or the like. Particularly in the case of writing H (high) data, refresh must be carried out before the difference between the voltage of a bit line which is read out from a memory cell and voltage VBL becomes lower than the sensitivity of the sense amplifier. Therefore, the data retain time of the entire chip is defined as tREFmax described in the foregoing depending upon the memory cell that has the shortest data retaining time in the chip.

Assuming that the number of refreshes required to refresh all the rows in memory arrays MA0–MAn is Nref, refresh request signal FAY is issued at the cycle of tREFmax/Nref. For example, in the 4K refresh mode of Nref=4096, refresh request signal FAY is issued for every 16 $\mu$s when the maximum refresh time tREFmax is 64 ms.

The system configuration of using an asynchronous general static random access memory (SRAM) that does not require supply of an external clock is widely employed in portable information terminals and the like. Since the memory that is required in high speed data processing is served by the cache memory incorporated in the processor, the function of high speed access is not required in an externally-provided data retaining SRAM.

Therefore, in order to simplify the system configuration in portable information terminals and the like that have severe requirement for reduction in size, a general purpose SRAM is employed that does not require complicated memory control associated with the refresh operation every each refresh cycle or control of suspending access to the currently-refreshed memory until the refresh cycle ends.

However, portable information terminals are significantly improved in the feature of handling images these few years, requiring the memory function of a large capacity. For SRAMs that have a memory size approximately ten times larger than that of the memory cells of DRAMs, the cost of the chip will be increased significantly by the memory of large capacity which results in raising the cost of the portable information terminal. Expectations are high for a DRAM as a substitute for SRAM.

Particularly for the embedded DRAM having a DRAM of large capacity integrated with the logic of high complexity or a microprocessor, high speed data transfer is allowed even if the operating frequency is set low by using an internal data bus of multibits. Furthermore, power consumption during operation can be reduced. Therefore, expectations towards application of a system LSI such as a logic-embedded DRAM is high. However, usage of a DRAM as a substitute for the SRAM is not so simple since the DRAM requires complicated memory control as to refresh.

SUMMARY OF THE INVENTION

An object of the present invention is to realize a system LSI incorporating a DRAM circuit block with memory control as simple as that of an SRAM used suitably in a portable information terminal and the like.

According to an aspect of the present invention, a semiconductor memory device includes a memory array, a refresh timer circuit, a command generation circuit, a row selection control circuit and a row select circuit.

The memory array includes a plurality of memory cells arranged in a matrix. The refresh timer circuit outputs a refresh request signal at a time interval required to refresh the data retained by a plurality of memory cells. The command generation circuit generates an internal command signal according to an access command. The row selection control circuit carries out an operation related to row selection of a memory array according to the internal command signal and refresh request signal. The row selection control circuit includes a timing control circuit rendered active according to an internal command signal to output timing signals of the row select operation of the memory array, a refresh control circuit receiving and holding a refresh request signal to output an internal refresh command signal when the timing control circuit is rendered inactive, and a refresh timing control circuit rendered active according to an internal refresh command signal to output timing signals instead of the timing control circuit. The row select circuit selects a row in a memory array according to the timing signals.

According to another aspect of the present invention, a semiconductor memory device includes a memory array, a command detection circuit, and a row selection control circuit.

The memory array includes a plurality of memory cells arranged in a matrix. The command detection circuit outputs a command detection signal indicating that an access command to the memory array has been applied and an internal command signal corresponding to the access command. The row selection control circuit carries out an operation related to row selection of the memory array according to an internal command signal.

The row selection control circuit includes a retain circuit taking in an applied row address according to a command detection signal and retaining the applied row address as an internal row address, and a comparison circuit comparing a row address with an internal row address at an elapse of a first predetermined time upon detection of change in the row address signal to determine whether to use the internal row address in the row selection of the memory array.

The main advantage of the present invention is that an operable DRAM core can be realized by applying a simple control signal without having to consider control of refresh since refresh is carried out after the normal operation of the memory array is completed when a refresh request signal is generated during a normal operation in response to an access command.

Another advantage of the present invention is prevention of erroneous readout of data from an erroneous address when noise of an unexpected short time appears in the address signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
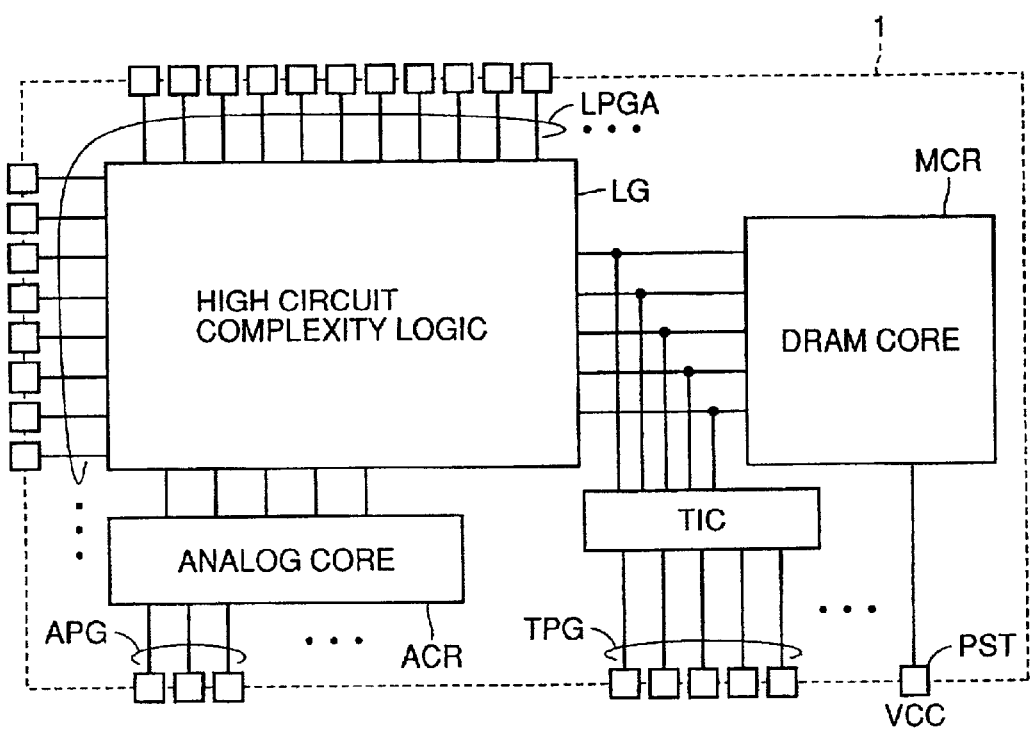
FIG. 1 schematically shows a structure of a DRAM-embedded system LSI of the present invention.

Embodiments of the present invention will be described hereinafter with reference to the drawings. In the drawings, the same reference characters denote the same or corresponding components.

First Embodiment

FIG. 1 schematically shows a structure of a DRAM-embedded system LSI of the present invention.

Referring to FIG. 1, the system LSI1 includes a logic LG of high circuit complexity coupled to an external pin terminal group LPGA to execute a designated process, an analog core ACR coupled between high circuit complexity logic LG and external pin terminal group APG to carry out a process for an analog signal, a DRAM core MCR coupled to high circuit complexity logic LG via internal wiring to store data required by this high circuit complexity logic LG, and a test interface circuit TIC disconnecting high circuit complexity logic LG from the DRAM in a test mode to carry out a test operation on DRAM core MCR via a test pin terminal group TPG. DRAM core MCR receives a power supply voltage VCC via a power supply pin terminal PST.

Analog core ACR includes a phase synchronous circuit (PLL) generating an internal clock signal, an analog/digital converter converting an externally applied analog signal into a digital signal, and a digital/analog converter converting the digital signal applied from high circuit complexity logic LG into an analog signal for output.

DRAM core MCR is a DRAM with memory control simplified to a level similar to that of the general asynchronous SRAM. DRAM core MCR receives a command from high circuit complexity logic LG to input and output data.

Figure 2:
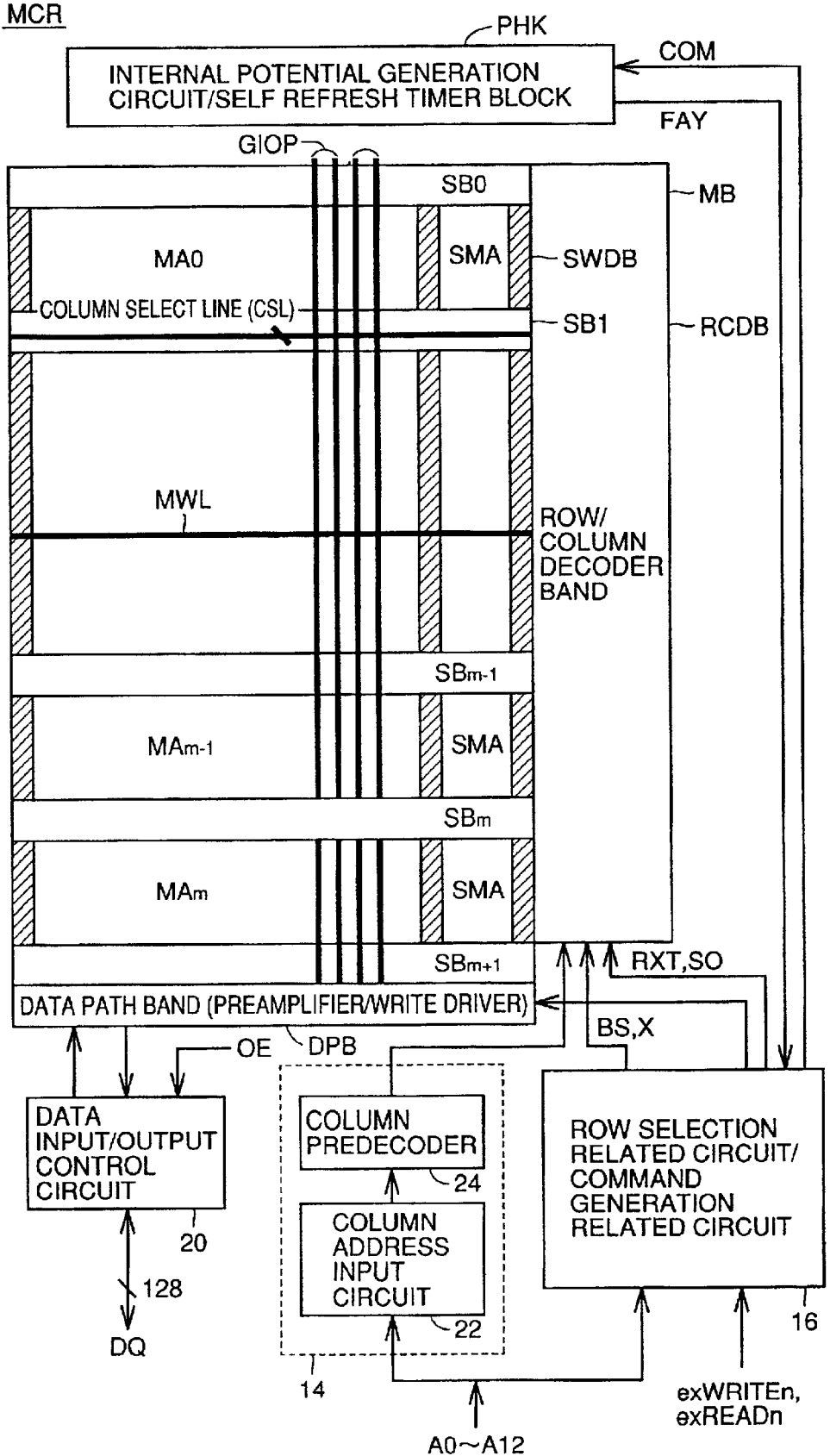
FIG. 2 is a schematic block diagram showing a structure of a DRAM core MCR of FIG. 1.

FIG. 2 is a schematic block diagram showing a structure of DRAM core MCR of FIG. 1.

Referring to FIG. 2, DRAM core MCR includes a memory array MB storing data, a row selection related circuit/command generation related circuit 16 responsive to, for example, 13-bit external address A0–A12 applied from high circuit complexity logic LG and external control signals exREADn and exWRITEn applied from high circuit complexity logic LG to generate an internal control signal specifying various operations, and providing a row related control signal such as a row predecoded signal, a column selection related circuit 14 receiving external addresses A0–A12 to generate a column related selection control signal, and a data input/output control circuit 20 transferring data between high circuit complexity logic LG and the memory array.

Data input/output control circuit 20 sends/receives a data signal DQ of 128 bits to/from high circuit complexity logic LG. Data input/output control circuit 20 outputs data read out from the memory array according to an output enable signal OE when in a read out mode.

Memory array MB includes plurality of memory arrays MA0–MAn, sense amplifier bands SB1–SBn arranged between memory arrays MA0-MAn, and sense amplifier bands SB0 and SBn+1 arranged outside memory arrays MA0 and MAn. Each of memory arrays MA0–MAn is divided into a plurality of submemory arrays SMA by subword driver band SWDB.

In each of memory arrays MA0–MAn, a plurality of main word lines are arranged common to submemory arrays SMA divided by subword driver band SWDB. A plurality of main word lines are arranged corresponding to a predetermined number of subword lines of each submemory array SMA of a corresponding memory array. A predetermined number of subdecode lines SDL arranged on the sense amplifier band and a main word line MWL are applied to a subword driver in subword driver band SWDB to select one subword line.

Each of sense amplifier bands SB1–SBn is shared by adjacent memory arrays. Corresponding to memory arrays MA0–MAn are provided a row decoder selecting a main word line and a subdecode line according to a row address signal, and a column decoder transmitting a column select signal via a column select line CSL to select a column from the memory array according to a column address signal in alignment with the row decoder.

Column select line CSL is arranged at the sense amplifier band, and connects a predetermined number of sense amplifier circuits to the group of internal data line pairs GIOP when selected. A predetermined number of internal data line pairs GIOP are arranged extending over memory arrays MA0–MAn, and coupled to a sense amplifier circuit selected via a local data line.

Figure 26:
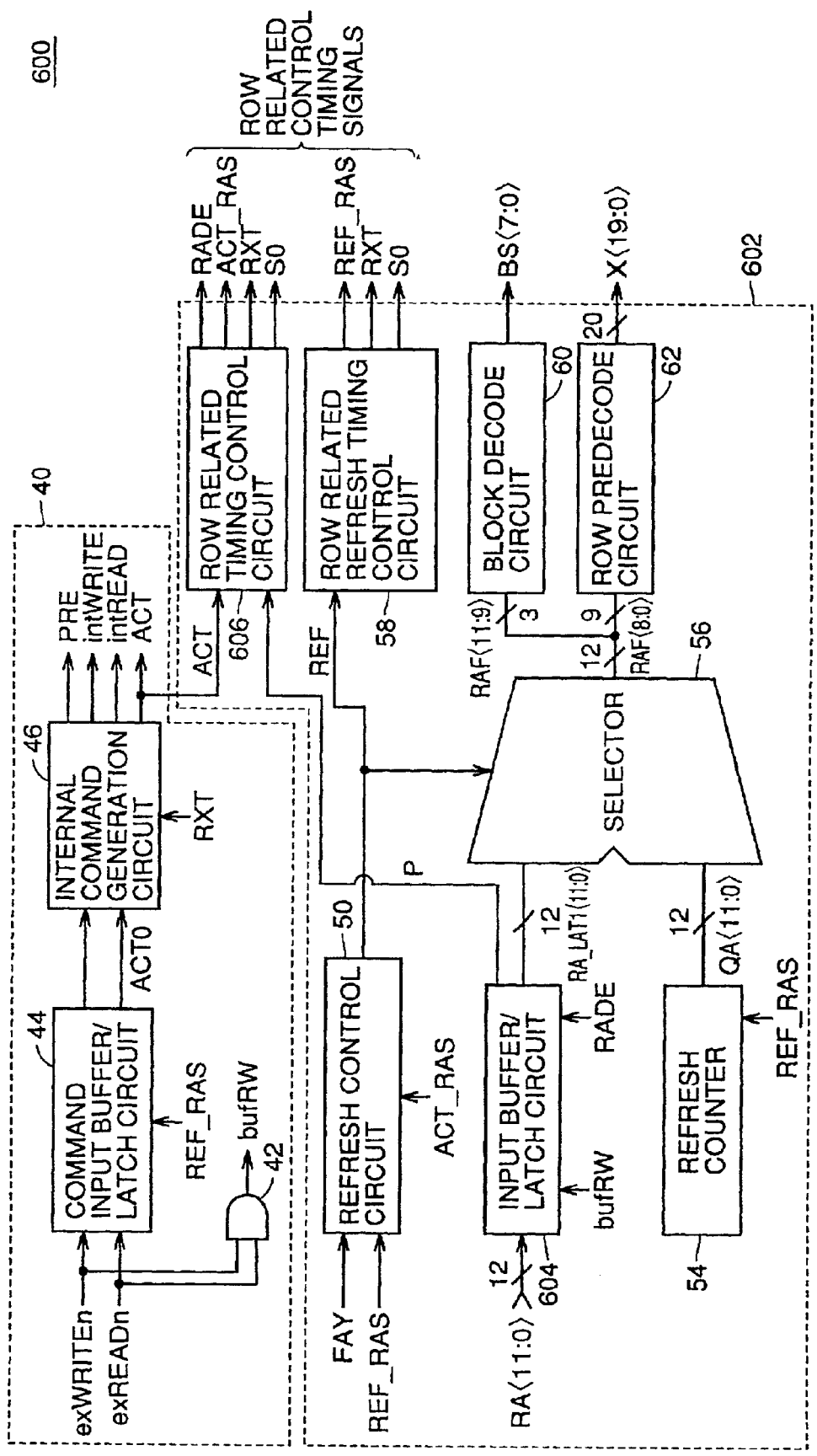
FIG. 26 is a block diagram showing a structure of a row selection related circuit/command generation related circuit 600 used in a fifth embodiment of the present invention.

By dividing memory array MB into more submemory arrays to reduce the size of submemory array SMA in comparison to that of the conventional DRAM block shown in FIG. 26, the row selection and sense operation by the sense amplifier are speeded since the length of the word line and the bit line is reduced.

Internal data line pair GIOP is coupled to a data path band DPB provided for 128 bits to 512 bits, including a preamplifier and a write driver. In this data path band DPB, a preamplifier and a write driver are arranged corresponding to each internal data line pair GIOP. Internal data line pair GIOP may be a transmission line pair transmitting both write data and read data, or may be provided as an internal data bus line pair in which a bus line pair for transmitting read out data and a write data line pair for transmitting write data are provided separately.

Figure 28:
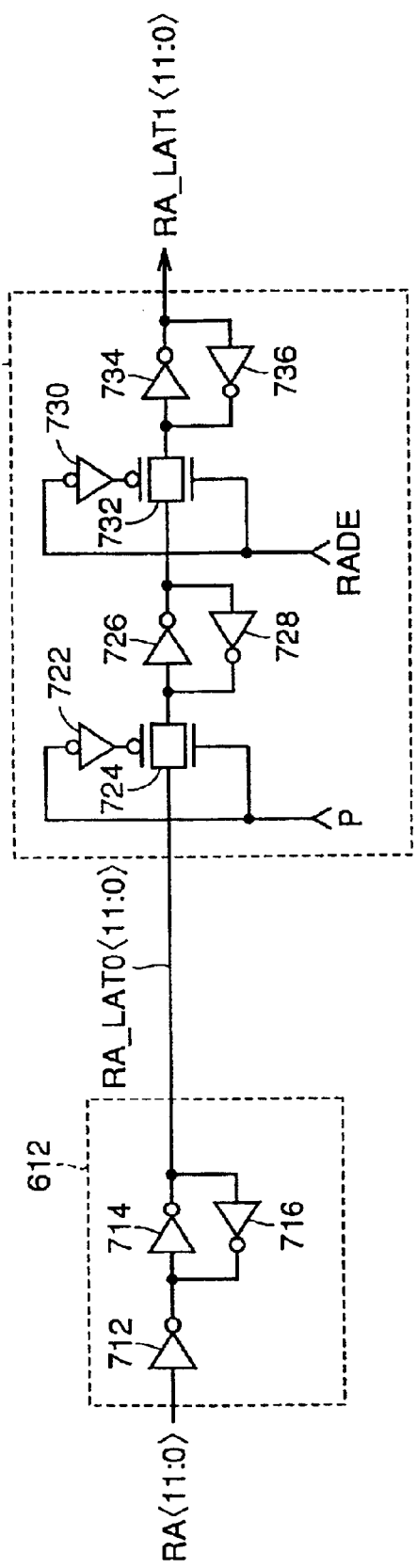
FIG. 28 is a circuit diagram showing an example of the structure of an input buffer & latch circuit 612 and a latch circuit 614 of FIG. 27.

External control signals exREADn and exWRITEn applied to row selection related circuit/command generation related circuit 16 correspond to the read command and write command designating data reading and data writing, respectively, applied according to a combination of external control signals of FIG. 28. Row selection related circuit/command generation related circuit 16 generates a predetermined internal command signal according to external control signals exREADn and exWRITEn.

Row selection related circuit/command generation related circuit 16 also receives external address bits A0–A12 as the row address to generate an internal row address signal.

Column selection related circuit 14 includes a column address input circuit 22 receiving external address signals A0–A12 to enter and hold a column address for output, and a column predecoder 24 receiving and predecoding a column address.

When an internal read command or internal write command is applied, column address input circuit 22 enters the bits of lower significance of external address bits A0–A12, for example address bits A0–A4, to generate an internal column address signal under control of row selection related circuit/command generation related circuit 16. Column address input circuit 22 includes an address buffer and an address latch.

The internal column address signal from column address input circuit 22 is applied to column predecoder 24.

The row selection related circuit predecodes an applied internal row address signal to apply the predecoded signal to the column decoder in row/column decoder band RCDB. Column predecoder 24 predecodes the internal column address signal from column address input circuit 22 to provide the predecoded signal to the column decoder in row/column decoder band RCDB.

Upon receiving a read command or a write command, the command generation related circuit generates an internal control signal to control the operation of data input/output control circuit 20 and the preamplifier and write driver included in data path band DPB.

The DRAM circuit block further includes a block PHK which has an internal voltage generation circuit generating internal voltages VPP, VCCS, VCCP, VBL and a self refresh timer rendering a refresh request signal FAY active at a predetermined interval. The self refresh timer can be implemented to automatically initiate activation of refresh request signal FAY after being reset by power-on-reset when the power of the DRAM core is turned on. Alternatively, a command can be applied to row selection related circuit/command generation related circuit 16 according to an externally applied control signal not shown in the DRAM core after power is turned on to have the self refresh timer initiate activation of refresh request signal FAY by the generated internal command COM.

Internal voltage VPP is transmitted on a selected subword line SWL, and takes a level higher than the operating power supply voltage. Voltage VCCS is the operating power supply voltage of the sense amplifier circuit in sense amplifier bands SB0~SBn+1, generated by an internal voltage-down converter circuit not shown. Voltage VCCP is a periphery power supply voltage generated by an internal voltage-down converter circuit not shown, serving as an operating power supply voltage applied to the peripheral circuits such as the row decoder and the column decoder included in row/column decoder band RCDB and the preamplifier and write driver in data path band DPB.

Voltage VBL is a bit line precharge voltage. Voltage VCP is a cell plate voltage applied to the cell plate of a memory cell, taking the middle voltage between the H level voltage and the L level voltage of the memory cell data. Voltages VBL and VCP are the middle voltage of the array power supply voltage (sense power supply voltage) VCCS.

The self refresh timer of block PHK is rendered active upon entering a self refresh mode to issue a refresh request signal FAY at a predetermined interval so that the refresh of all the rows in memory arrays MA0–MAn is completed once at the maximum refresh time tREXmax.

Figure 3:
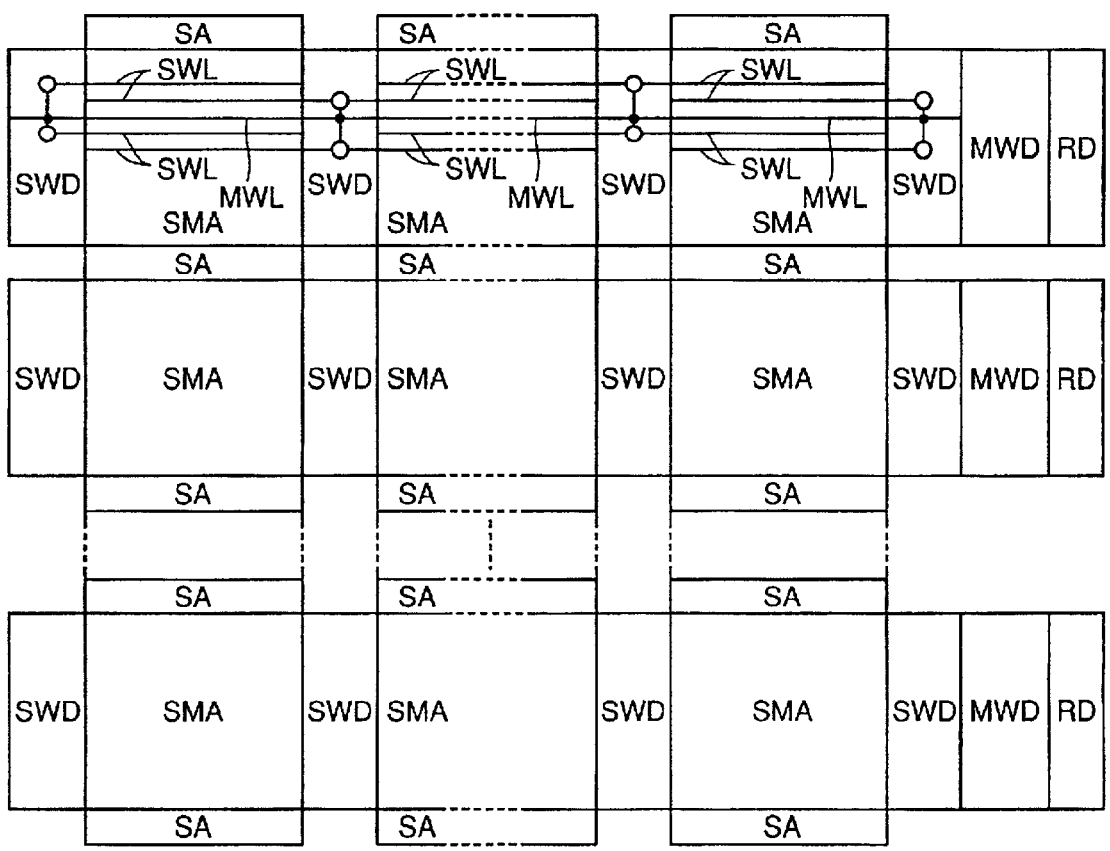
FIG. 3 schematically shows a structure of a memory array MB in FIG. 2.

FIG. 3 schematically shows a structure of a memory array MB of FIG. 2.

In memory array MB of FIG. 3, the memory cell array is divided into a plurality of submemory arrays SMA. A subword driver band SWD and a sense amplifier band SA are arranged with respect to each of the plurality of submemory arrays SMA. A plurality of main word lines MWL extend in the row direction so as to traverse the plurality of submemory arrays SMA arranged in the row direction. Subword line SWL connected to main word line MWL via subword driver SWD extends along the row direction within submemory array SMA. Main word line MWL is driven by a main word driver MWD according to a signal of row decoder RD.

Figure 4:
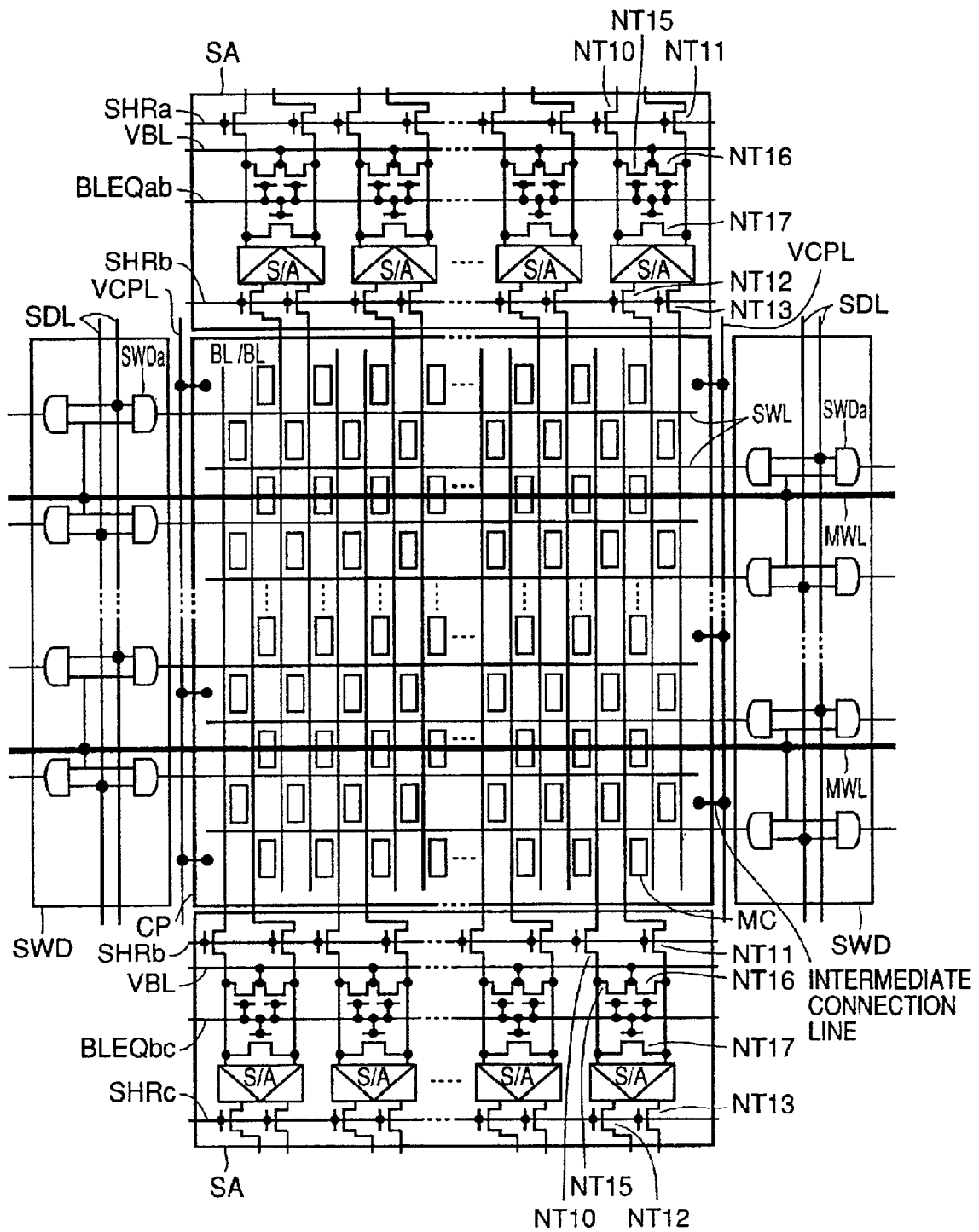
FIG. 4 schematically shows the connection between a submemory array SMA and the subword driver SWD and sense amplifier SA arranged in the neighborhood thereof of FIG. 3.

FIG. 4 schematically shows the connection between submemory array SMA and subword driver SWD and sense amplifier SA arranged at the neighborhood of submemory array SMA of FIG. 3.

Referring to FIG. 4, submemory array SMA includes a plurality of memory cells MC arranged in a matrix. A subword line SWL is connected to the gate of memory cells MC arranged in the same row. This subword lines SWL is connected to each driver SWDa of subword driver band SWD. Memory cell MC arranged in the same one column are connected to any one of bit lines BL and /BL. Bit line pair BL and /BL is connected to either the upper or lower sense amplifier S/A in FIG. 4 via N channel MOS transistors NT10 and NT11 receiving a shared gate signal SHRb at their gates.

Sense amplifier band SA forms sense amplifier bands SB0~SBm+1 extending horizontally in FIG. 4. Sense amplifier band SA includes a plurality of equalize circuits with N channel MOS transistors NT15~NT17 as the composing elements in addition to a plurality of S/A share circuits and plurality of sense amplifiers S/A with N channel MOS transistors NT10–NT13 as composing elements. The equalize circuit functions to apply a precharge voltage VBL to bit lines BL and /BL.

Subword line SWL is driven by a subword driver SWDa according to a signal on main word line MWL and the signal on subdecode line SDL.

Figure 5:
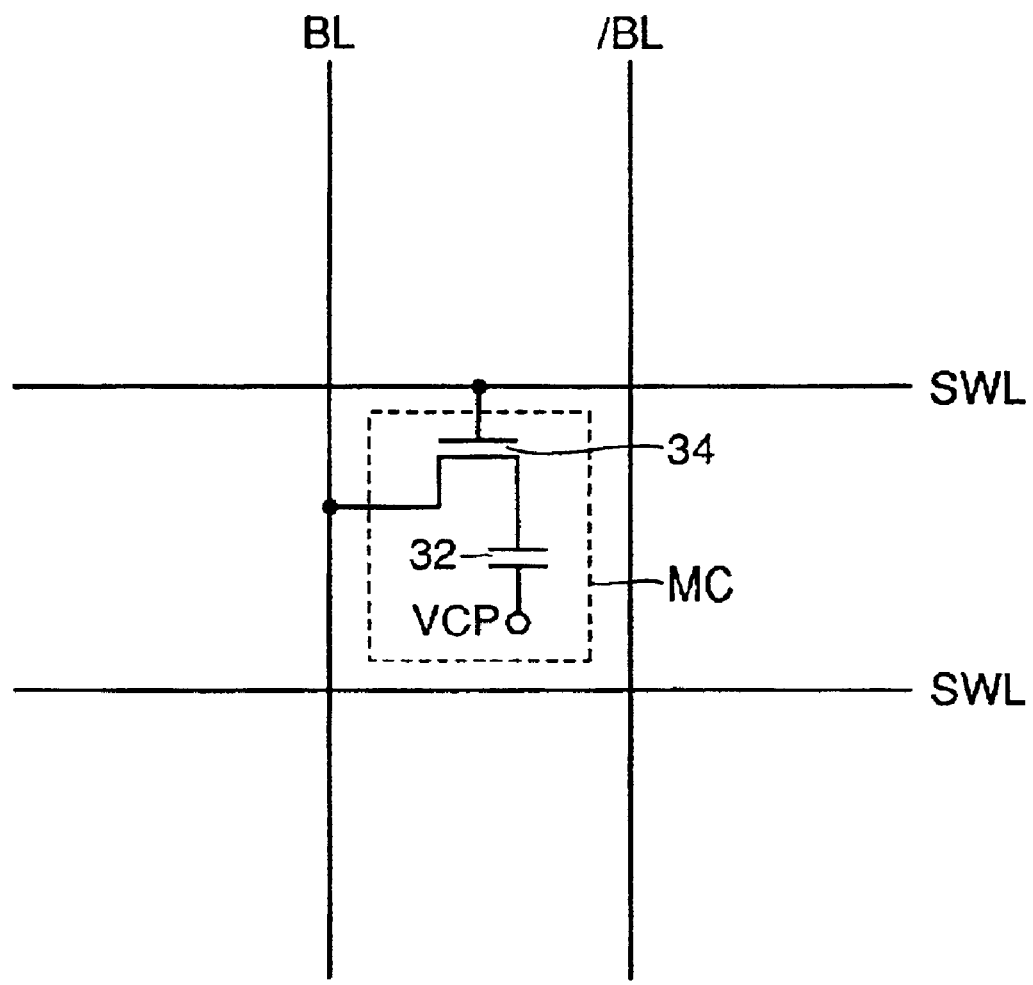
FIG. 5 is a circuit diagram showing an example of a structure of a memory cell MC of FIG. 4.

FIG. 5 is a circuit diagram showing a structural example of memory cell MC of FIG. 4.

Referring to FIG. 5, memory cell MC includes a capacitor 32 having one end connected to a cell plate to receive a cell plate voltage VCP, and an N channel MOS transistor 34 connected between the other end of capacitor 32 and bit line BL, having a gate connected to subword line SWL.

Cell plate CP connected to one end of capacitor 32 is extended all over substantially the entire region of sub-memory array SMA as shown in FIG. 4. Cell plate CP is fixed to a cell plate voltage VCP by being connected at a plurality of sites to a VCP power supply line VCPL extending in the proximity of the border between submemory array SMA and subword driver band SWD.

According to the structure of the above-described memory array, the numbers of memory arrays MA0–MAm is increased by reducing the size of each memory array in order to shorten the time required for row address access and cycle in comparison to those of the conventional DRAM block described with reference to FIG. 26. Also, memory array MAm is divided into more submemory arrays to reduce the size of submemory array SMA than that of the conventional one. Therefore, two cycles of the DRAM operation is allowed with respect to the cycle time, for example, 70 ns, defined by the product standard of the low speed SRAM employed in the portable information equipment.

Figure 6:
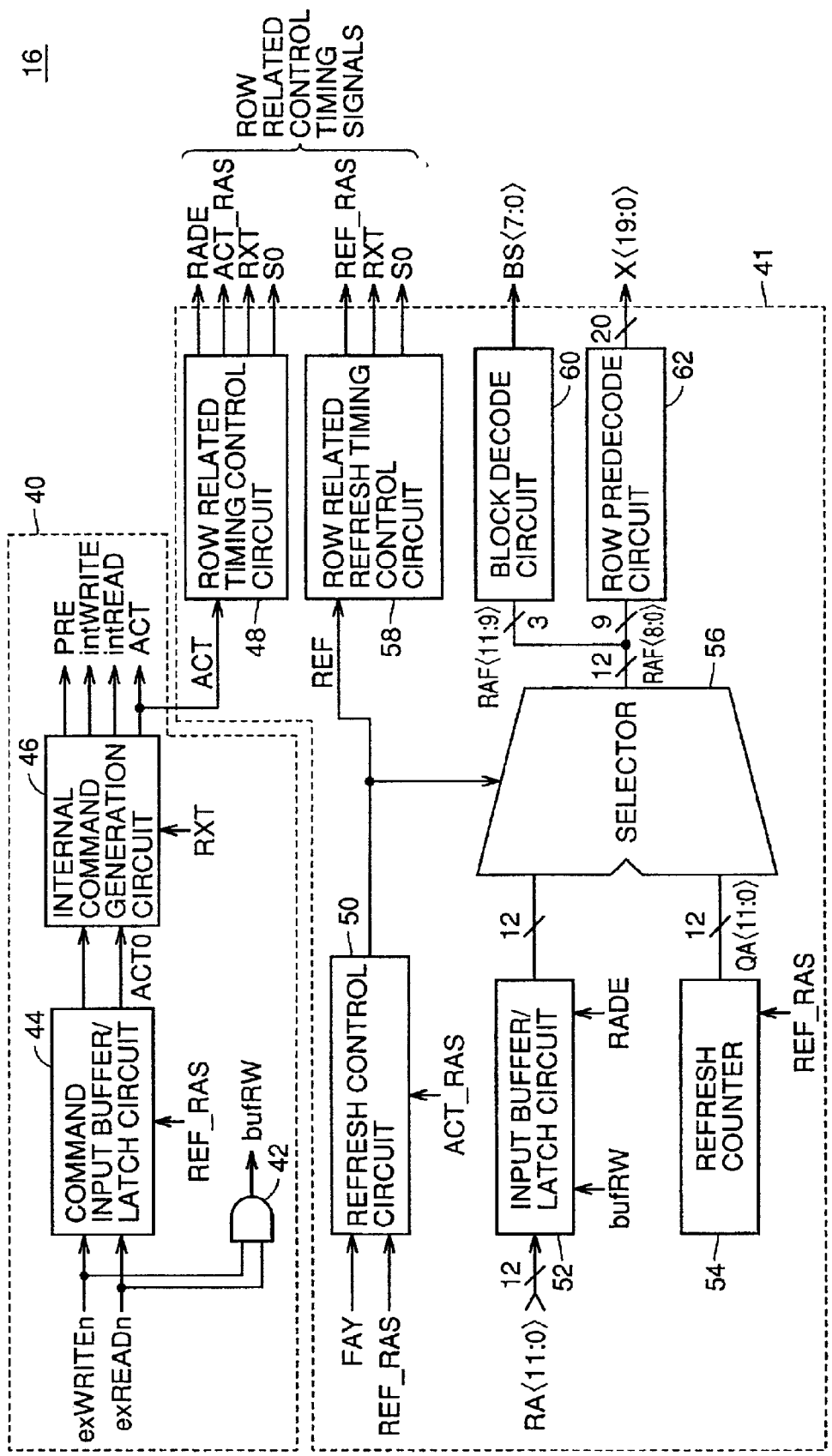
FIG. 6 is a block diagram showing a structure of a row selection related circuit/command generation related circuit 16 of FIG. 2.

FIG. 6 is a block diagram showing a structure of row selection related circuit/command generation related circuit 16 of FIG. 2.

Referring to FIG. 6, row selection related circuit/command generation related circuit 16 includes a row selection control circuit 41 and a command generation circuit 40.

Command generation circuit 40 includes an AND circuit 42 receiving external control signals exWRITEn and exREADn to output a signal bufRW, a command input buffer/latch circuit 44 responsive to external control signals exWRITEn and exREADn and a refresh activation signal REF_RAS to render a row active command signal ACT0 active, and an internal command generation circuit 46 responsive to row active command signal ACT0 and word line drive timing signal RXT to output internal command signals ACT, PRE, intWRITE, and intREAD.

Row selection control circuit 41 is provided corresponding to eight memory arrays MA0–MA7. In each of memory arrays MA0–MA7, 512 word lines (subword lines) are arranged.

Row selection control circuit 41 includes an input buffer/latch circuit 52 responsive to activation of a row address enable signal RADE to take in and latch externally applied row address bit RA<11:0> of 12 bits, a refresh counter 54 responsive to inactivation of refresh activation signal REF_RAS to increment the count value, a selector 56 selecting the output bit of input buffer/latch circuit 52 and refresh counter 54 according to refresh activation signal REF, a block decode signal 60 decoding internal row address RAF<11:9> of the which are the more significant 3 bits of the 12-bit row address from selector 56 to generate a block select signal BS<7:0> specifying a memory array, and a row predecoded signal 62 predecoding a row address RAF<8:0> of the least significant nine bits from selector 56.

Refresh activation signal REF_RAS is rendered active for a predetermined time in response to the self refresh request signal. Selection of the row to be refreshed and a refresh operation of memory cell data are executed in the selected submemory array SMA during the active period.

Selector 56 selects output bit QA<11:0> from refresh counter 54 when refresh activation signal REF is active, and selects the output bit of input buffer/latch circuit 52 when refresh activation signal REF is inactive.

Refresh counter 54 increments by one the address in the range of address bit QA<11:0> in a refresh mode.

Block decode circuit 60 and row predecode circuit 62 can be provided common to memory arrays MA0–MA7 of the memory mat, or provided corresponding to each of memory arrays MA0–MA7.

When row predecode circuit 62 is provided corresponding to each memory arrays, row predecode circuit 62 is selectively rendered active in response to block select signal BS<7:0> from block decode circuit 60. Row predecode circuit 62 provided corresponding to the selected memory array (specified) executes a predecode operation.

Row selection control circuit 41 further includes a refresh control circuit 50 providing a refresh activation signal REF according to refresh request signal FAY issued from the self refresh timer, a normal operation signal ACT_RAS, and refresh activation signal REF_RAS, a row related refresh timing control circuit 58 generating row related control timing signals at a predetermined sequence when refresh activation signal REF is rendered active, and a row related timing control circuit 48 generating row related control timing signals at a predetermined sequence according to a row active command signal ACT.

Refresh control circuit 50 renders a refresh activation signal REF active as will be described afterwards when refresh request signal FAY is applied. Following generation of various control signals at a predetermined sequence by row related refresh timing control circuit 58 according to refresh activation signal REF, row related refresh timing control circuit 58 drives refresh activation signal REF_RAS to an inactive state at the elapse of a predetermined time from activation of sense amplifier activation signal SO. By these series of operations, one self refresh operation is completed. When refresh activation signal REF_RAS is rendered inactive, refresh counter 54 increments refresh address QA<11:0> by one.

Figure 7:
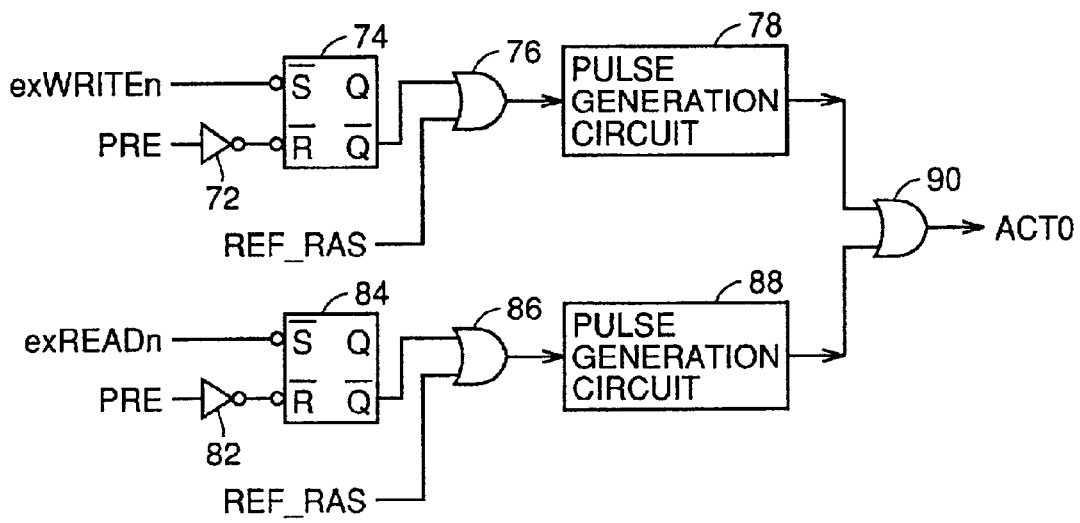
FIG. 7 is a circuit diagram showing a structure of a command input buffer/latch circuit 44 of FIG. 6.

FIG. 7 is a circuit diagram showing a structure of command input buffer/latch circuit 44 of FIG. 6.

Referring to FIG. 7, command input buffer/latch circuit 44 includes an inverter 72 receiving and inverting an internal precharge command signal PRE, a latch circuit 74 set when external write command signal exWRITEn attains an L level and reset when the output of inverter 72 attains an L level, an OR circuit 76 receiving an inverted output/Q of latch circuit 74 and refresh activation signal REF_RAS, and a pulse generation circuit 78 receiving the output of OR circuit 76 to generate a pulse according to the change thereof.

Command input buffer/latch circuit 44 further includes an inverter 82 receiving and inverting internal precharge command signal PRE, a latch circuit 84 set when external read command signal exREADn attains an L level and reset when the output of inverter 82 attains an L level, an OR circuit 86 receiving an inverted output /Q of latch circuit 84 and refresh activation signal REF_RAS, and a pulse generation circuit 88 generating a pulse signal according to the output of OR circuit 86, and an OR circuit 90 receiving outputs of pulse generation circuits 78 and 88. OR circuit 90 provides a row active command signal ACT0.

Figure 8:
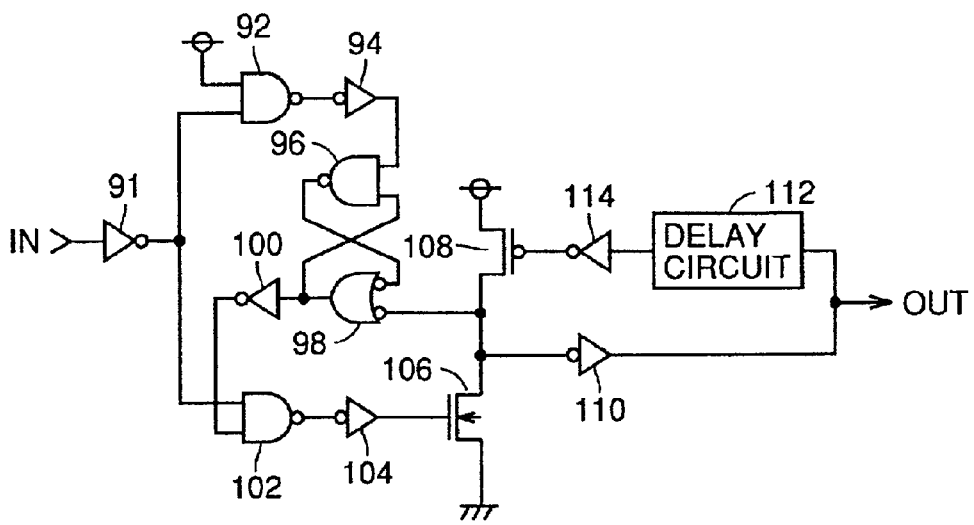
FIG. 8 is a circuit diagram showing a structure of a pulse generation circuit 78 of FIG. 7.

FIG. 8 is a circuit diagram showing a structure of pulse generation circuit 78 of FIG. 7. The details of pulse generation circuit 78 is disclosed in K. Dosaka et al., "A 90-MHz 16-Mb System Integrated Memory with Direct Interface to CPU", IEICE TRANS ELECTRON VOL.E79-C, pp. 948–955, NO. 7 JULY 1996.

Referring to FIGS. 7 and 8, pulse generation circuit 78 includes an inverter 91 receiving and inverting an input signal IN, a NAND circuit 92 receiving the output of inverter 91 and a power supply potential at the inputs, an inverter 94 receiving and inverting the output of NAND circuit 92, NAND circuits 96 and 98 having respective one inputs cross-coupled to each other, and an inverter 100 receiving and inverting the output of NAND circuit 98. The output of inverter 94 is applied to the other input of NAND circuit 86.

Pulse generation circuit 78 further includes a NAND circuit 102 receiving the outputs of inverter 91 and inverter 100 at the inputs, an inverter 104 receiving and inverting the output of NAND circuit 102, a P channel MOS transistor 108 and an N channel MOS transistor 106 connected in series between the power supply node and the ground node, and an inverter 110 receiving and inverting the potential of the connection node between P channel MOS transistor 108 and N channel MOS transistor 106 to output a signal OUT. The output of inverter 104 is applied to the gate of N channel MOS transistor 106. The potential of the connection node of P channel MOS transistor 108 and N channel MOS transistor 106 is applied to the other input of NAND circuit 98.

Pulse generation circuit 78 further includes a delay circuit 112 receiving and delaying output signal OUT, and an inverter 114 receiving and inverting the output of delay circuit 112 to provide the inverted output to the gate of P channel MOS transistor 108.

Pulse generation circuit 88 of FIG. 7 has a structure similar to that of pulse generation circuit 78. Therefore, description thereof will not be repeated.

Figure 9:
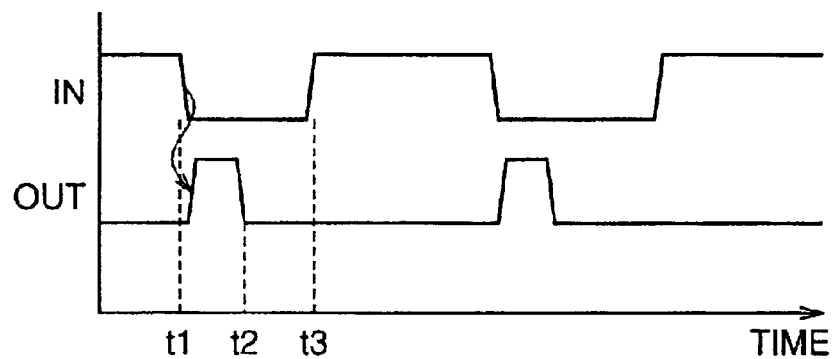
FIG. 9 is an operation waveform diagram to describe an operation of pulse generation circuit 78 of FIG. 8.

FIG. 9 is an operation waveform diagram to describe the operation of pulse generation circuit 78 of FIG. 8.

Referring to FIGS. 8 and 9, when input signal IN is pulled down from an H level to an L level at time t1, the output of inverter 104 changes to an H level and N channel MOS transistor 106 is rendered conductive. Then, output signal OUT is driven from an L level to an H level. At this time point, the latch circuit formed by NAND circuits 96 and 98 is set to drive the output of inverter 104 to an L level, whereby N channel MOS transistor 106 is rendered nonconductive.

At the rise of input signal IN at time t3, the output of inverter 94 is driven to an L level and the latch circuit formed by NAND circuits 96 and 98 is reset. Then, the output of inverter 100 is pulled up to an H level and pulse generation circuit 78 waits for the next fall of input signal IN.

At the rise of input signal IN at time t3, pulse generation circuit 78 will not alter output signal OUT.

Figure 10:
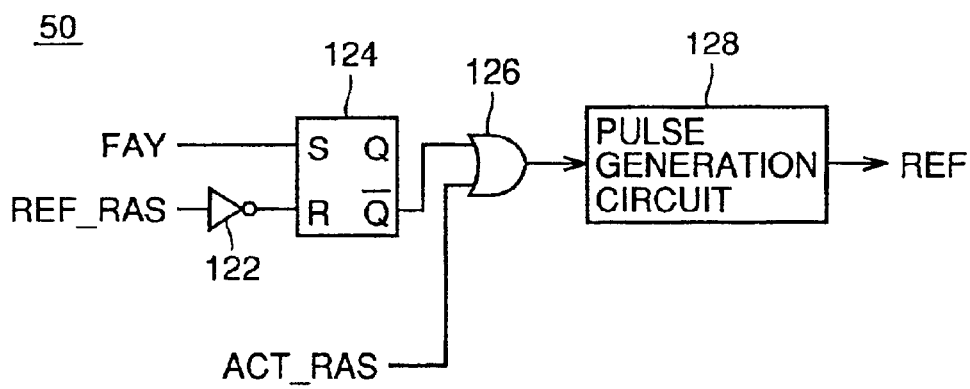
FIG. 10 is a circuit diagram showing a structure of a refresh control circuit 50 of FIG. 6.

FIG. 10 is a circuit diagram showing a structure of refresh control circuit 50 of FIG. 6.

Referring to FIG. 10, refresh control circuit 50 includes an inverter 112 receiving and inverting refresh activation signal REF_RAS, a latch circuit 124 set and reset according to activation of refresh request signal FAY and the output of inverter 122, respectively, an OR circuit 126 receiving the inverted output /Q of latch circuit 124 and normal operation signal ACT_RAS, and a pulse generation circuit 128 receiving the output of OR circuit 126 to generate a pulse signal. The output of pulse generation circuit 128 is internal refresh command signal REF.

Figure 11:
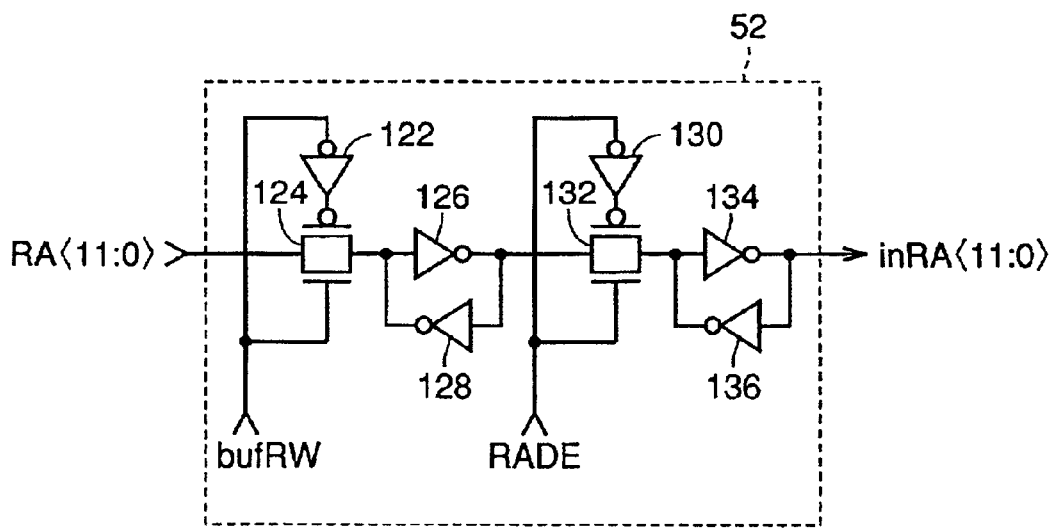
FIG. 11 is a circuit diagram showing a structure of an input buffer/latch circuit 52 of FIG. 6.

FIG. 11 is a circuit diagram showing a structure of input buffer/latch circuit 52 of FIG. 6.

Referring to FIG. 11, input buffer/latch circuit 52 includes an inverter 122 receiving and inverting a signal bufRW, and a transmission gate 124 rendered active in response to the output of inverter 122 and signal bufRW to transmit an internal row address signal RA<11:0>.

Input buffer/latch circuit 52 further includes inverters 126 and 128 forming a latch to latch external row address signal RA<11:0> transmitted by transmission gate 124, an inverter 130 receiving and inverting row address enable signal RADE, and a transmission gate 132 rendered active according to inverter 130 and row address enable signal RADE to transmit the output of inverter 126.

Input buffer/latch circuit 52 further includes inverters 134 and 136 forming a latch circuit maintaining the output of inverter 126 transmitted by transmission gate 132. The output of inverter 134 is internal row address signal in RA<11:0>.

A circuit of a structure similar to that of the circuit diagram of FIG. 11 is provided in parallel corresponding to the number of bits of external row address signal RA<11:0>. The circuit diagram of FIG. 11 shows a structure corresponding to one bit as a representative thereof.

Figure 12:
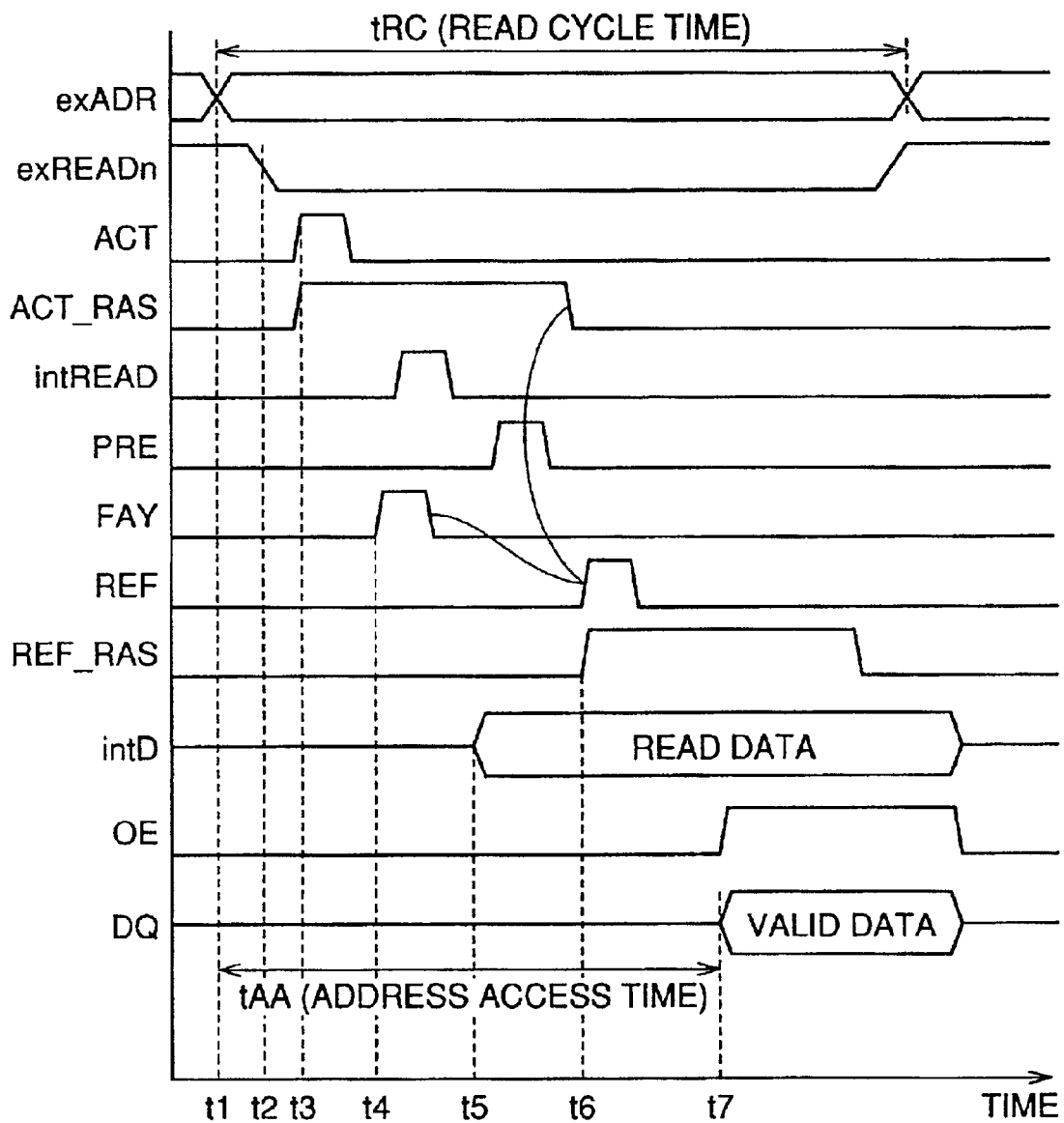
FIG. 12 is first operation waveform diagram in a read out mode to describe an operation of row related circuitry of a first embodiment.

FIG. 12 is a first operation waveform diagram in a read out mode to describe the operation of row related circuitry of the first embodiment.

Referring to FIGS. 6 and 12, the self refresh timer in internal voltage generation circuit/self refresh timer block PHK of FIG. 2 is constantly operating in a normal operation mode. A refresh request signal FAY is generated for every refresh period.

At time t1, external address signal exADR is input. At time t2, external read command signal exREADn is input. Row active command signal ACT is rendered active at time t3 according to internal command generation circuit 46. At the same time, normal operation signal ACT_RAS is rendered active.

When normal operation signal ACT_RAS is rendered active even when a refresh request signal is input at time t4, refresh control circuit 50 does not render internal refresh command signal REF active even through the input refresh request signal is maintained.

Row related timing control circuit 48 responds to row active command signal ACT to render internal read command signal intREAD active at predetermined timing, whereby internal precharge command PRE is rendered active. Internal data intD is output at time t5 from the memory array.

In response to the fall of normal operation signal ACT_RAS at time t6, the refresh control circuit renders internal refresh command signal REF active according to the information in the latch that is set by refresh request signal FAY. Row related refresh timing control circuit 58 renders refresh activation signal REF_RAS active by a predetermined time to generate a refresh cycle.

At time t7 corresponding to an elapse of a predetermined address access time tAA from the input of external address signal exADR at time t1, output enable signal OE is rendered active, and valid data is output as data signal DQ.

The activation period of normal operation signal ACT_RAS starting from the output of internal command signal ACT up to completion of data read out from the memory array is called the normal read cycle time. The activation period of refresh activation signal REF_RAS starting from the output of internal refresh command signal REF up to completion of refresh of the portion designated by internal refresh command signal of the memory array is called the refresh cycle time. Accordingly, the basic cycle time of the semiconductor memory device receiving a read command up to returning to a state that allows reception of an access command such as the read or write command is at least the summation time of the normal read cycle time and refresh cycle time.

Figure 13:
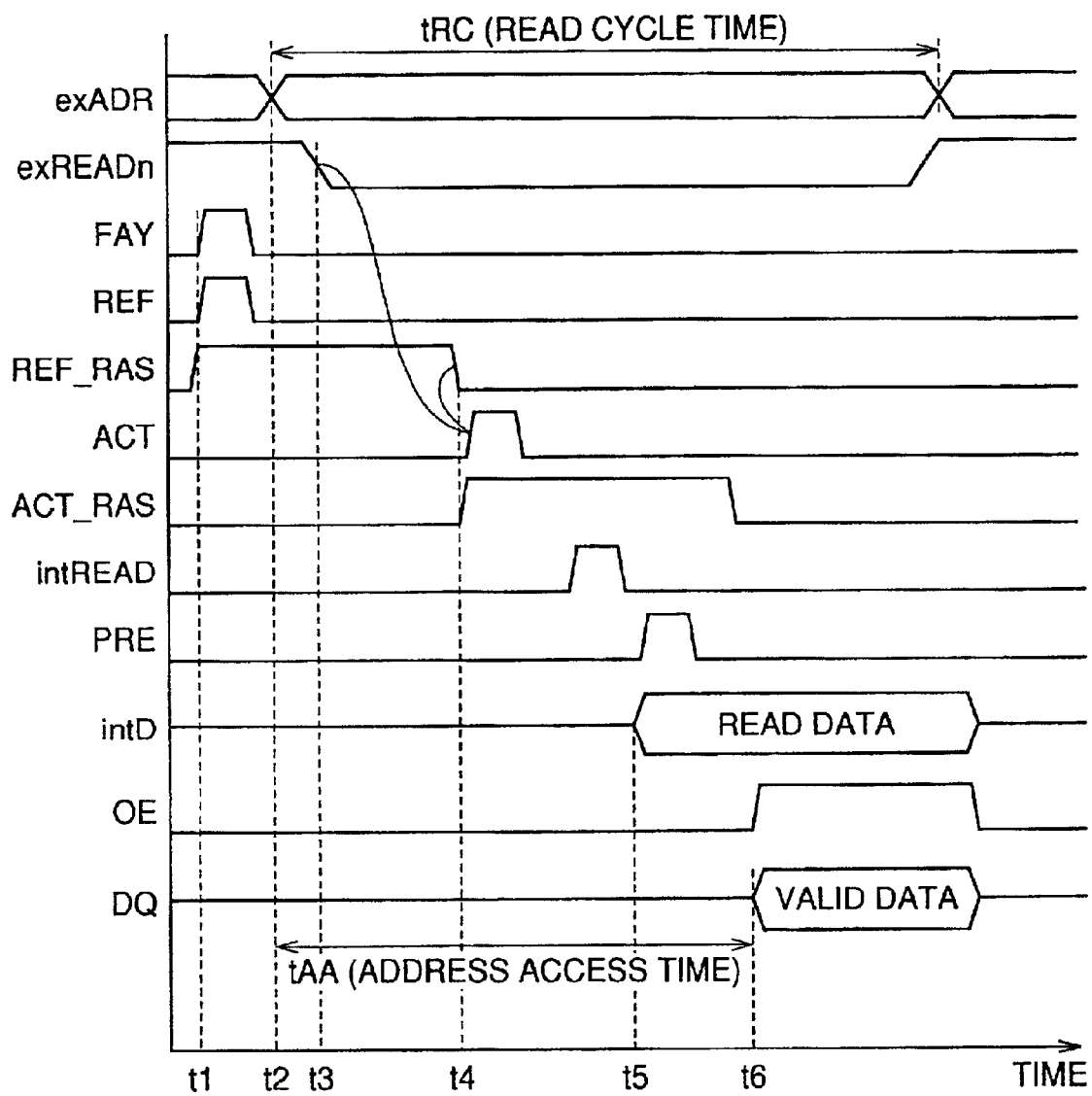
FIG. 13 is a second operation waveform diagram in a read out mode to describe an operation of row related circuitry.

FIG. 13 is a second operation waveform diagram in a read out mode to describe the operation of row related circuitry.

Referring to FIGS. 6 and 13, when refresh request signal FAY is input prior to external read command signal exREADn, refresh control circuit 50 confirms that normal operation signal ACT_RAS is at an inactive state, and outputs an internal refresh command signal REF. Row related refresh timing control circuit 58 renders refresh activation signal REF_RAS active for a predetermined time to enter a refresh cycle, and carries out a refresh operation for the row selected by internal address QA<11:0> generated by the refresh counter, i.e. the page selected by row predecoded signal X<19:0> in the memory array selected by block select signal BS<15:0>.

At time t2, external address signal exADR is input. At time t3, external read command exREADn is input. However, command input buffer/latch circuit 44 does not render row active command signal ACT0 active since refresh activation signal REF_RAS is in an active state.

When refresh activation signal REF_RAS is rendered inactive at time t4, command input buffer/latch circuit 44 renders row active command signal ACT0 active. In response, internal command generation circuit 46 generates row active command signal ACT. Row related timing control circuit 48 renders normal activation signal ACT_RAS active for a predetermined time. In parallel to this operation, internal command generation circuit 46 sequentially renders internal read command signal intREAD and internal precharge command signal PRE active at a predetermined timing after the issue of row active command signal ACT. At time t5, internal data intD is read out from the memory mat.

At time t6 corresponding to an elapse of an address access time tAA from t2, the valid data is output as data signal DQ in response to activation of output enable signal OE.

Figure 14:
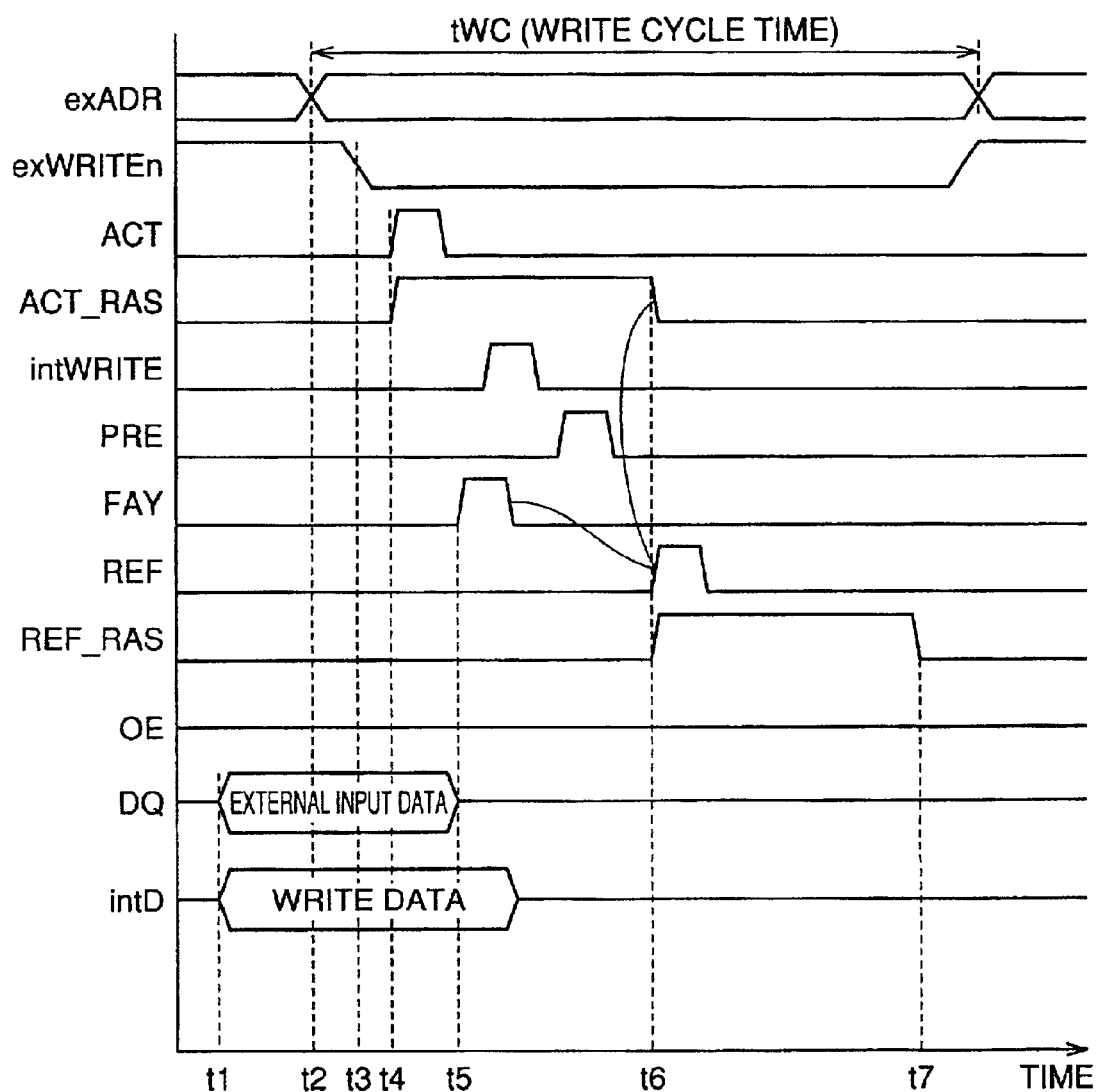
FIG. 14 is a first operation waveform diagram to describe a row related signal in a write mode.

FIG. 14 is a first operation waveform diagram to describe the row related signal in a write mode.

Referring to FIGS. 6 and 14, external input data is applied as data signal DQ at time t1 in a write mode. Internal data intD is maintained as the write data. At time t2, external address signal extADR is input. At time t3, external write command signal extWRITEn is input. At time t4, row active command signal ACT is issued and normal operation signal ACT_RAS is rendered active by the command input buffer/latch circuit and internal command generation circuit 46. At a predetermined timing, internal write command signal intWRITE and internal precharge command signal PRE are generated.

Even if refresh request signal FAY is input at time t5 during an active period of normal operation signal ACT_RAS, refresh control signal 50 does not immediately render internal refresh command signal REF active. Internal refresh command signal REF is rendered active after the normal operation signal is rendered inactive at time t6. During the activation of refresh activation signal REF_RAS for a predetermined time, row related refresh timing control circuit 58 causes the refresh operation for the memory array.

Figure 15:
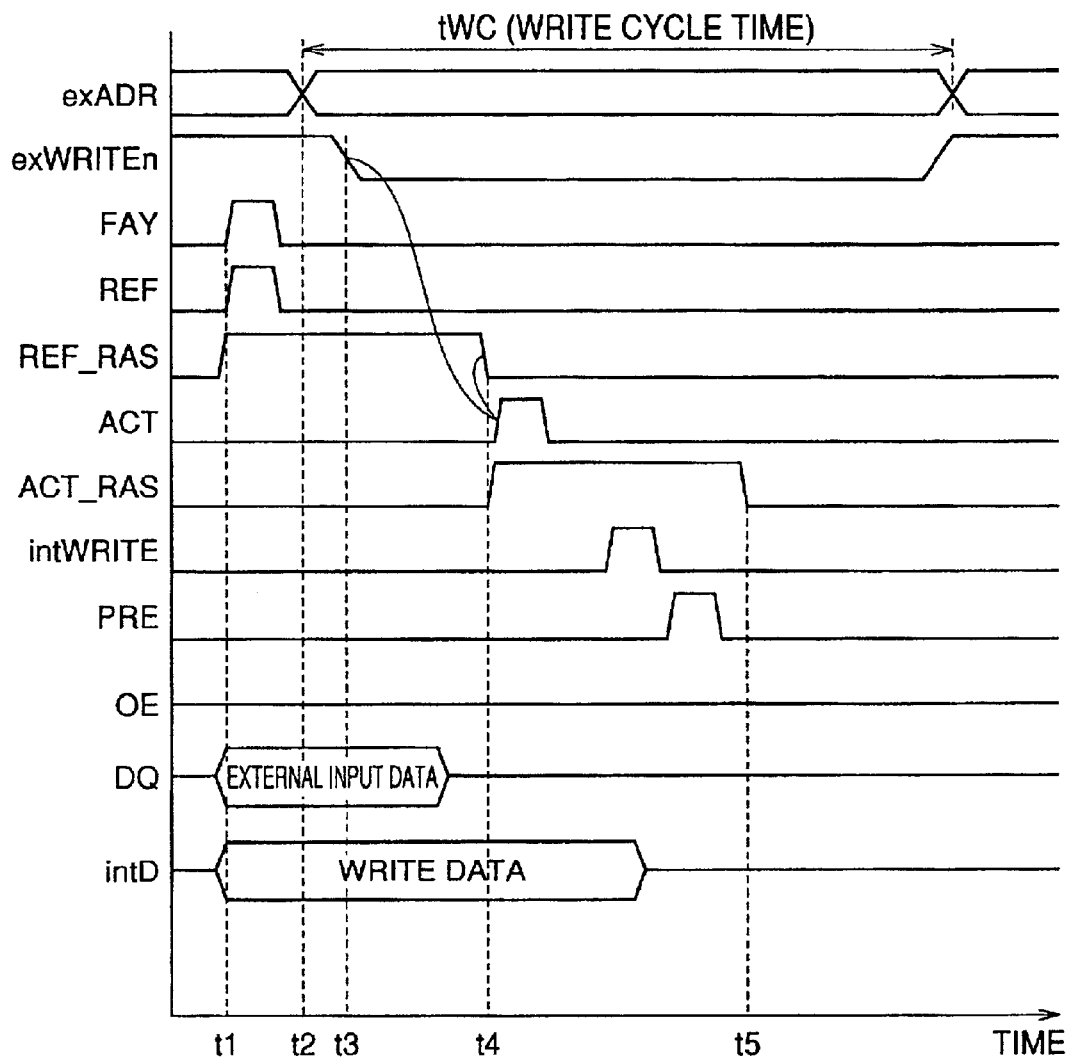
FIG. 15 is a second operation waveform diagram to describe an operation of row related circuitry in a write mode.

FIG. 15 is a second operation waveform diagram to describe the operation of the row related circuit in a write mode.

Referring to FIGS. 6 and 15, following initiation of a refresh operation according to refresh request signal FAY at time t1, when external address signal exADR and external write command signal exWRITEn are input at time t2 and t3, respectively, command input buffer/latch circuit 44 operates to generate row active command signal ACT after refresh activation signal REF_RAS is rendered inactive.

External row address signal RA<11:0> is latched in synchronization with external read command signal exREADn or external write command signal exWRITEn, which is then sent to block decode circuit 60 or row predecode circuit 62 in synchronization with row address enable signal RADE.

During time t4–t5, the externally applied write data stored as internal data intD is written into the memory array.

As described above, output enable signal OE is activated to render the output data valid at the elapse of an address access time tAA even if an internal read operation is carried out in the first cycle or in the second cycle at the elapse of the refresh cycle in the read cycle. Therefore, the read data is held on the internal data bus when a read operation is carried out in the first cycle. Therefore, the output timing of the read data is defined by address access time tAA of the specification.

When a write operation is carried out in the second cycle in the write cycle, the externally applied data that is latched is held until internal write command signal intWRITE is issued.

Then, row active command signal ACT is rendered active at internal command generation circuit 46 and applied to row related timing control circuit 48, followed by generation of various row related control signals. When word line drive master signal RXT is generated, an internal read command signal intREAD or internal write command signal intWRITE is generated according to an external command in internal command generation circuit 46. Furthermore, an internal precharge command signal PRE is generated after a predetermined delay time.

In other words, the number of submemory arrays in the DRAM is increased to shorten the cycle time so that an access operation of two cycles to the memory array is allowed within the cycle time defined by the product specification of the low speed SRAM. When a refresh request arrives after a memory access request, the operation with respect to the refresh request is deferred until completion of the read or write operation. When a memory access request arrives during a refresh operation, the memory access operation is carried out after the refresh operation ends. Therefore, an interface operable with control as simple as that of a low speed SRAM can be provided when viewed from outside the DRAM core.

Second Embodiment

Figure 16:
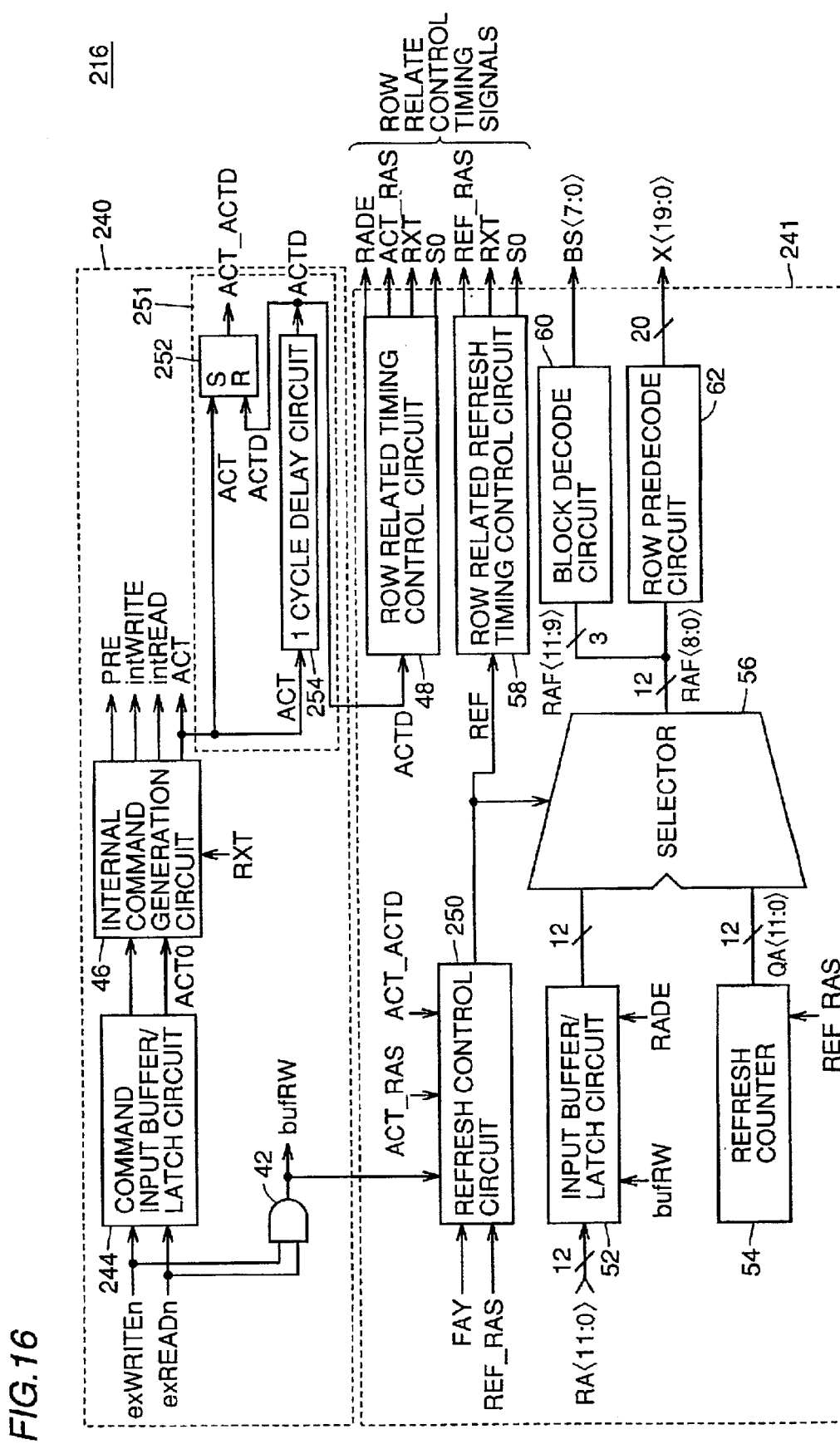
FIG. 16 is a block diagram showing a structure of a row selection related circuit/command generation related circuit 216 used instead of row selection related circuit/command generation related circuit 16 of a second embodiment.

FIG. 16 is a block diagram showing a structure of a row selection related circuit/command generation related circuit 216 employed instead of row selection related circuit/command generation related circuit 16 of the first embodiment.

Referring to FIG. 16, row selection related circuit/command generation related circuit 216 includes a command generation circuit 240 and a row selection control circuit 241.

Command generation circuit 240 differs from command generation circuit 40 of FIG. 6 in that a command input buffer/latch circuit 244 is provided instead of command input buffer/latch circuit 44, and a delay circuit 251 is included. The remaining structure is similar to that of command generation circuit 40, and description thereof will not be repeated.

Delay circuit 251 includes a one cycle delay circuit 254 delaying the input signal for a delay time corresponding to one cycle of the refresh cycle to output a row active delay signal ACTD and a latch circuit 252 set by row active command signal ACT and reset by row active delay signal ACTD to output a delay period display signal ACT_ACTD.

Command input buffer/latch circuit 244 differs in that a row active command signal ACT0 is transmitted to the internal command generation circuit irrespective of the state of refresh activation signal REF_RAS.

Row selection control circuit 241 differs from row selection control circuit 41 in that a refresh control circuit 250 is provided instead of refresh control circuit 50 in the structure of row selection control circuit 41 of FIG. 6. The remaining structure is similar to that of row selection control circuit 41. and description thereof will not be repeated.

Figure 17:
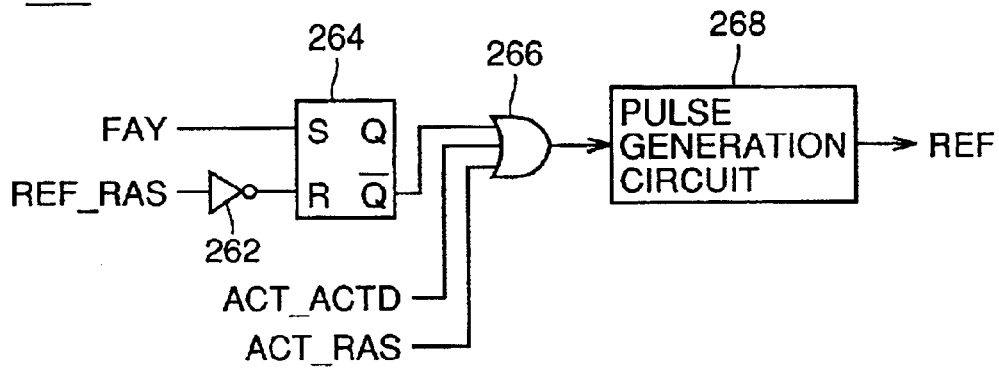
FIG. 17 is a circuit diagram showing a structure of a refresh control circuit 250 of FIG. 16.

FIG. 17 is a circuit diagram showing a structure of refresh control circuit 250 of FIG. 16.

Referring to FIG. 17, refresh control circuit 250 includes an inverter 262 receiving and inverting refresh activation signal REF_RAS, a latch circuit 264 set accorcling to refresh request signal FAY and reset according to an output of inverter 262, an OR circuit 266 receiving an inverted output/Q of latch circuit 264, a delay time display signal ACT_ACTD and normal 25 operation signal ACT_RAS, and a pulse generation circuit 268 receiving the output of OR circuit 266 to generate a pulse. Pulse generation circuit 268 outputs an internal refresh command signal REF.

Figure 18:
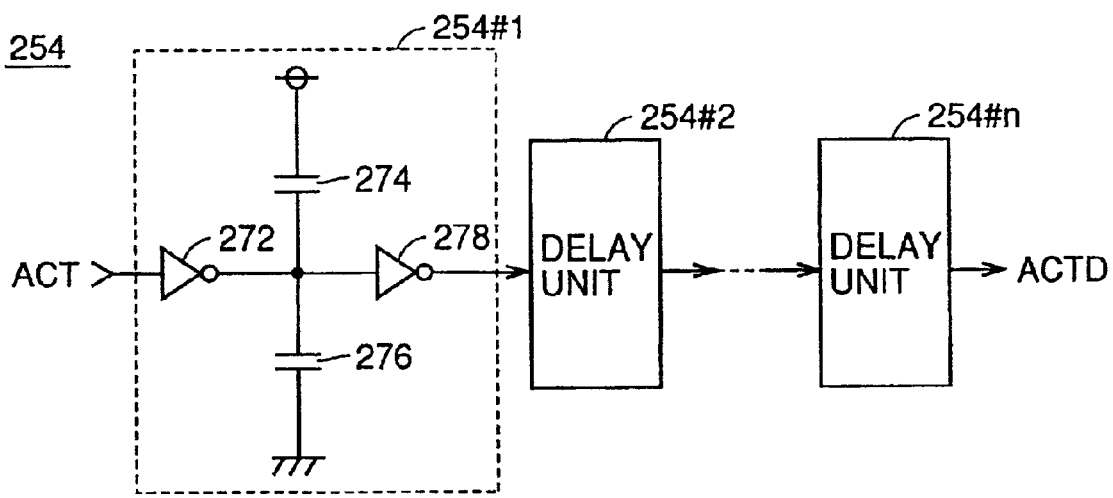
FIG. 18 is a circuit diagram showing a structure of a one cycle delay circuit 254 of FIG. 16.

FIG. 18 is a circuit diagram showing a structure of one cycle delay circuit 254 of FIG. 16.

Referring to FIG. 18, one cycle delay circuit 254 includes delay units 254#1–254#n connected in series to receive and delay for a predetermined time a row active command signal ACT Delay unit 254#n outputs a row active delay signal ACTD.

Delay unit 254#1 includes an inverter 272 receiving and inverting row active command signal ACT, a capacitor 274 coupled between the output node of inverter 272 and the power supply node, a capacitor 276 coupled between the output node of inverter 272 and the ground node, and an inverter 278 receiving and inverting the output of inverter 272 for output. Delay units 254#2-254#n have a structure similar to that of delay unit 254#1. Thereof, description thereof will not be repeated.

The number of delay units 254#1–254#n connected in series is adjusted so as to delay a row activation for the first cycle time corresponding to the refresh activation time when a read command or write command is input. One cycle delay circuit 254 generates a row active delay signal ACTD.

Figure 19:
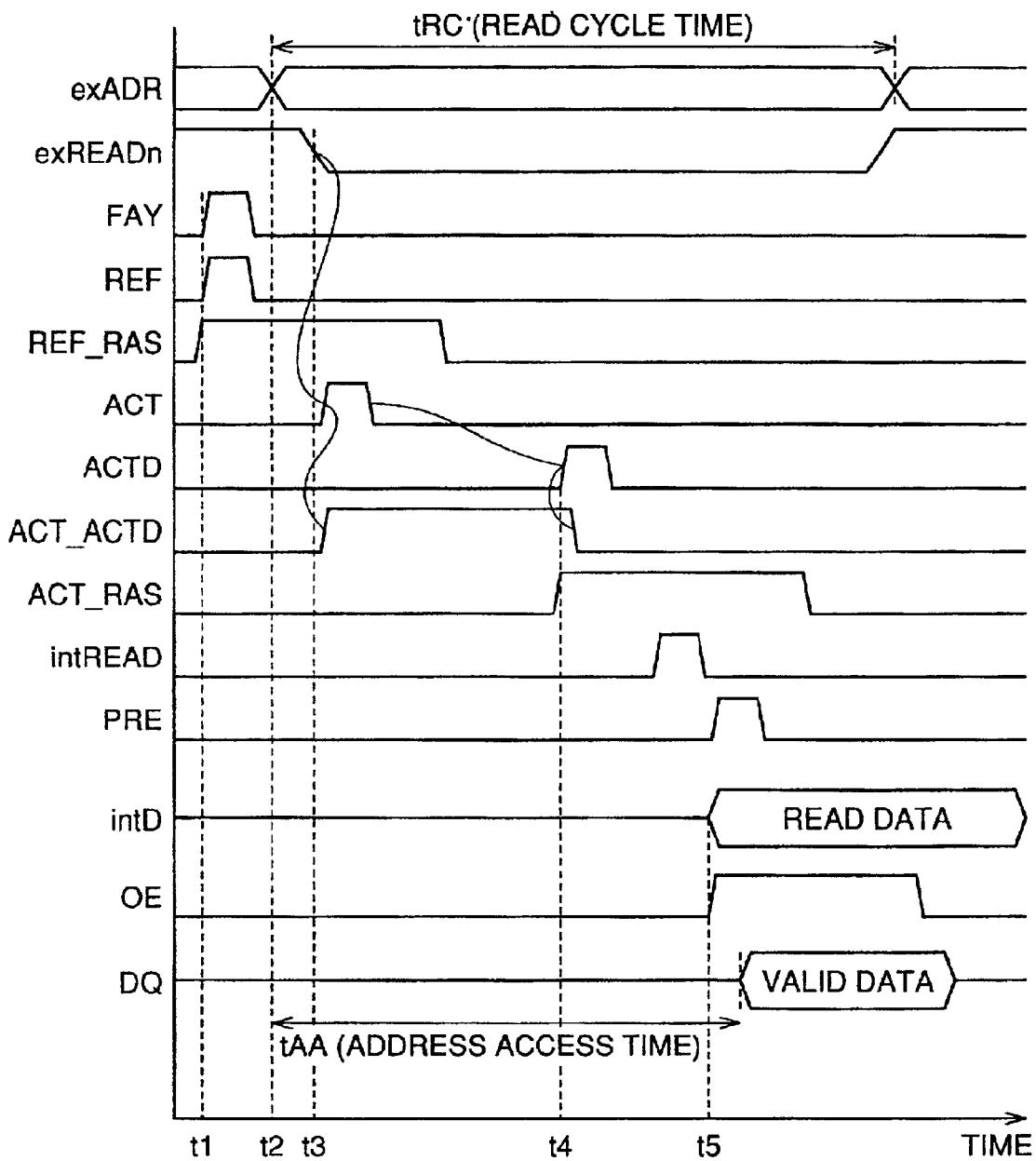
FIG. 19 is an operation waveform diagram to describe a row related signal in the second embodiment.

FIG. 19 is an operation waveform diagram to describe the row related signal of the second embodiment.

Referring to FIGS. 16 and 19, when a refresh request signal FAY is issued prior to entering a read cycle or a write cycle at time t1, internal refresh command signal REF is rendered active in response to refresh request signal FAY. Also, refresh activation signal REF_RAS is rendered active.

At time t2 and t3, external address signal exADR and external read command signal exREADn are input, respectively. Row active command signal ACT generated according to an input internal read command signal exREADn is delayed by the first cycle time by one cycle delay circuit 254 to be transmitted to row related timing control circuit 48 as row active delay signal ACTD regardless of whether the chip is currently in a refresh operation or not. During the delay period, delay time display signal ACT_ACTD is rendered active by latch circuit 252. Therefore, the refresh cycle started by refresh signal FAY can be ended during the delaying period.

When row active delay signal ACTD delayed by one refresh cycle time is rendered active at time t4, row related timing control circuit 48 renders normal operation signal ACT_RAS active. In response to word line drive master signal RXT, internal read command signal intREAD and internal precharge command signal PRE are sequentially rendered active at a predetermined timing. At time t5, data is read out from the memory array, and then the valid data is output as data signal DQ.

Figure 20:
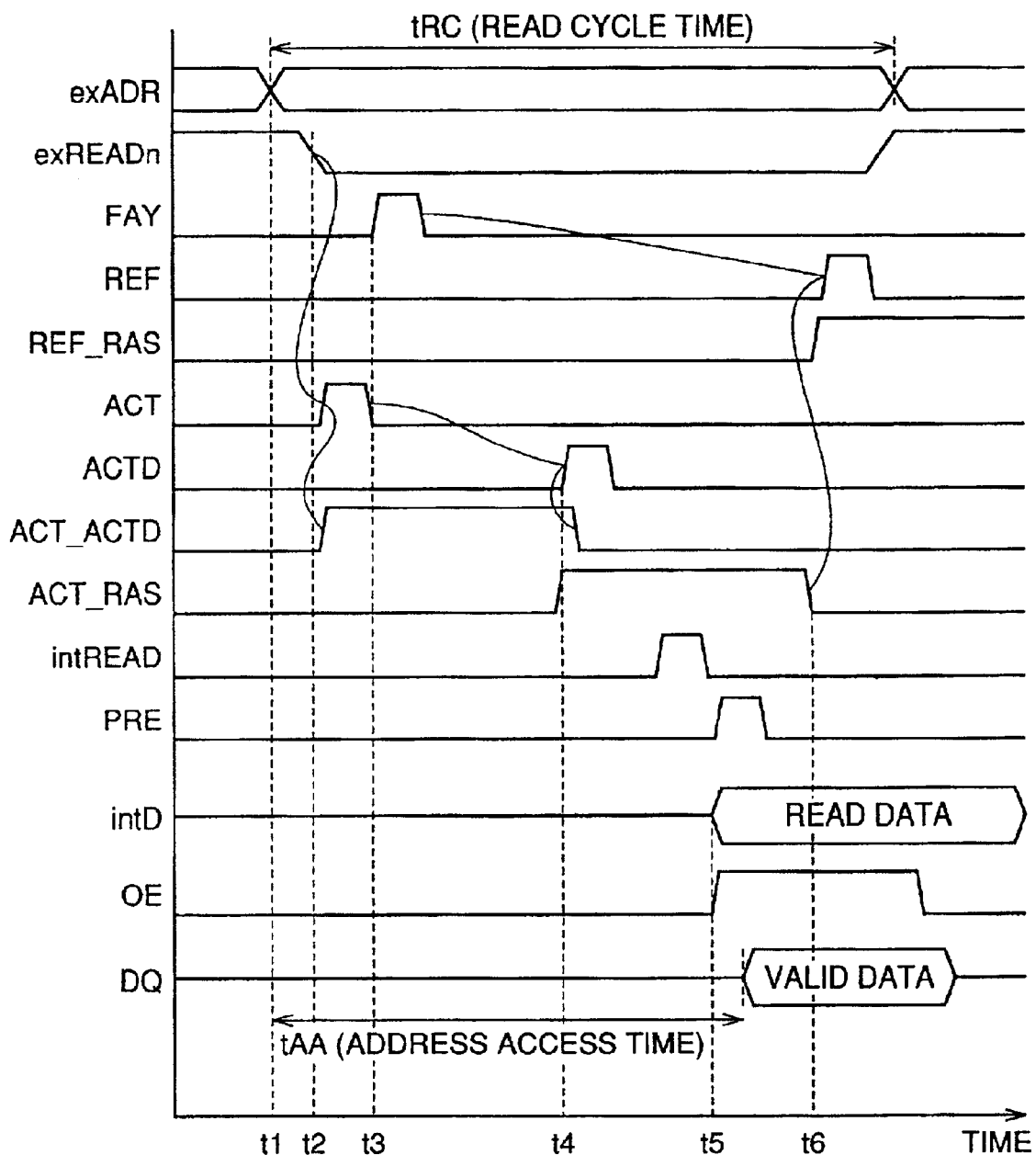
FIG. 20 is a second operation waveform diagram to describe a row related signal of the second embodiment.

FIG. 20 is a second operation waveform diagram to describe the row related signal of the second embodiment.

Referring to FIGS. 16 and 20, the case where refresh request signal FAY is input during activation of delay time display signal ACT_ACTD or normal operation signal ACT_RAS will be described.

At time t1, external address signal exADR is input. At time t2, external read command signal exREADn is input. Similar to the case shown in FIG. 19, row active delay signal ACTD corresponding to row active command signal ACT delayed by a predetermined time is generated. In response, normal operation signal ACT_RAS is rendered active, and the read out operation is carried out during time t4–time t6.

At time t6, when normal operation signal ACT_RAS is pulled down, refresh control circuit 250 renders internal refresh command signal REF active and enters a refresh operation.

It is to be noted that a read operation or a write operation is carried out in the memory array always after a predetermined refresh time even when a read command or write command is input during the refresh operation in the second embodiment. Therefore, the read or write operation will be carried out after the refresh operation ends.

When a read or write command is input in the case where refresh is not carried out, input of refresh request signal FAY causes a refresh operation to be executed only after the normal operation of read or write is completed. Thus, the DRAM core can be used with an interface similar to that of SRAM without having to apply a complicated control signal for the refresh operation.

Third Embodiment

Figure 21:
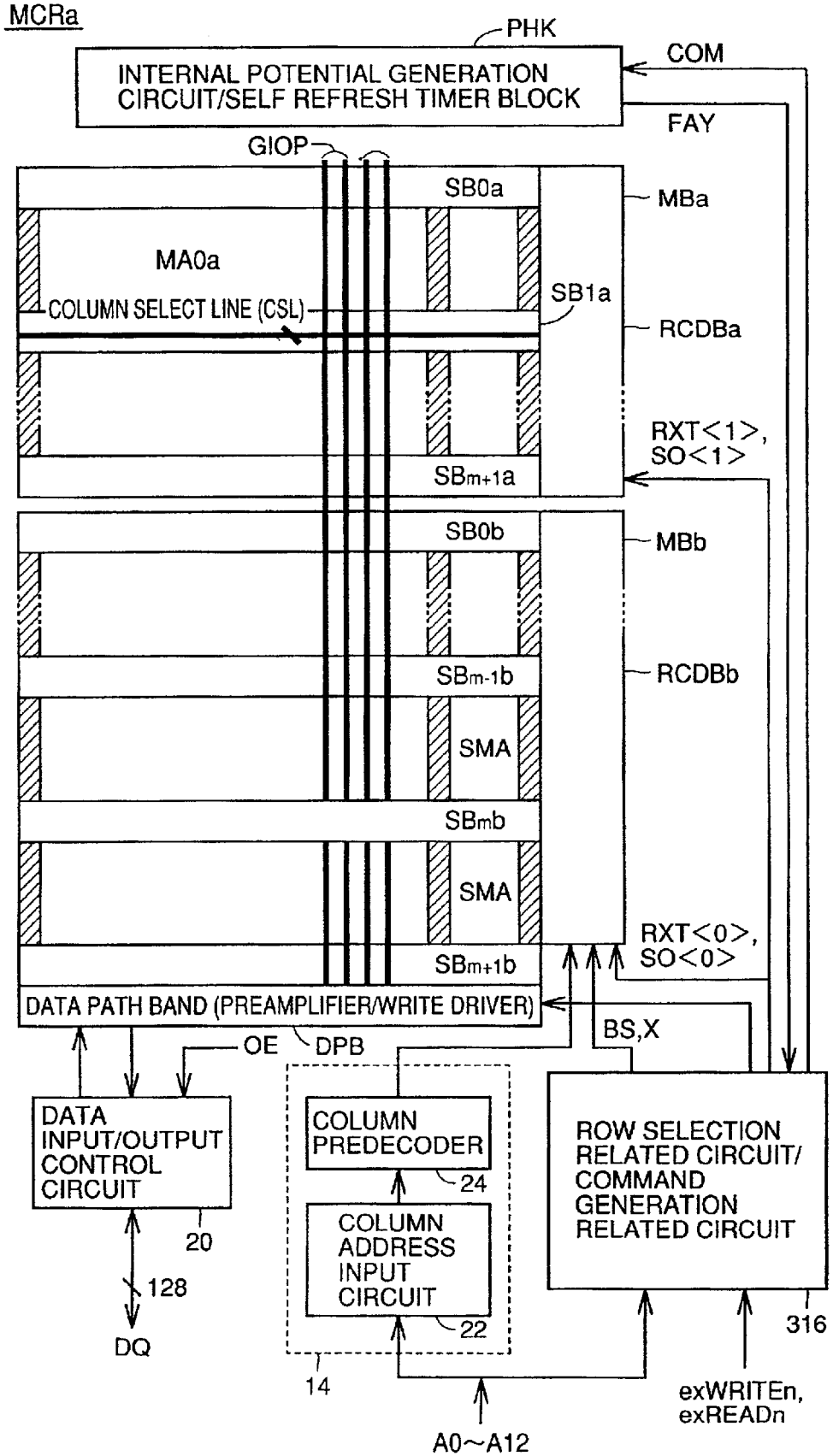
FIG. 21 is a block diagram showing a structure of a DRAM core MCRa used in a third embodiment.

FIG. 21 is a block diagram showing a structure of a DRAM core MCRa employed in the third embodiment.

Referring to FIG. 21, DRAM core MCRa is a 2-bank structured DRAM core, and differs from DRAM core MCR of FIG. 2 in that memory arrays MBa and MBb are provided instead of memory array MB, and a row selection related circuit/command generation related circuit 316 is provided instead of row selection related circuit/command generation related circuit 16. The remaining elements are similar to those of DRAM core MCR, and description thereof will not be repeated.

A row related control timing signal and a row predecoded signal are transmitted from row selection related circuit/command generation related circuit 316 on a signal bus differing from each bank.

Figure 22:
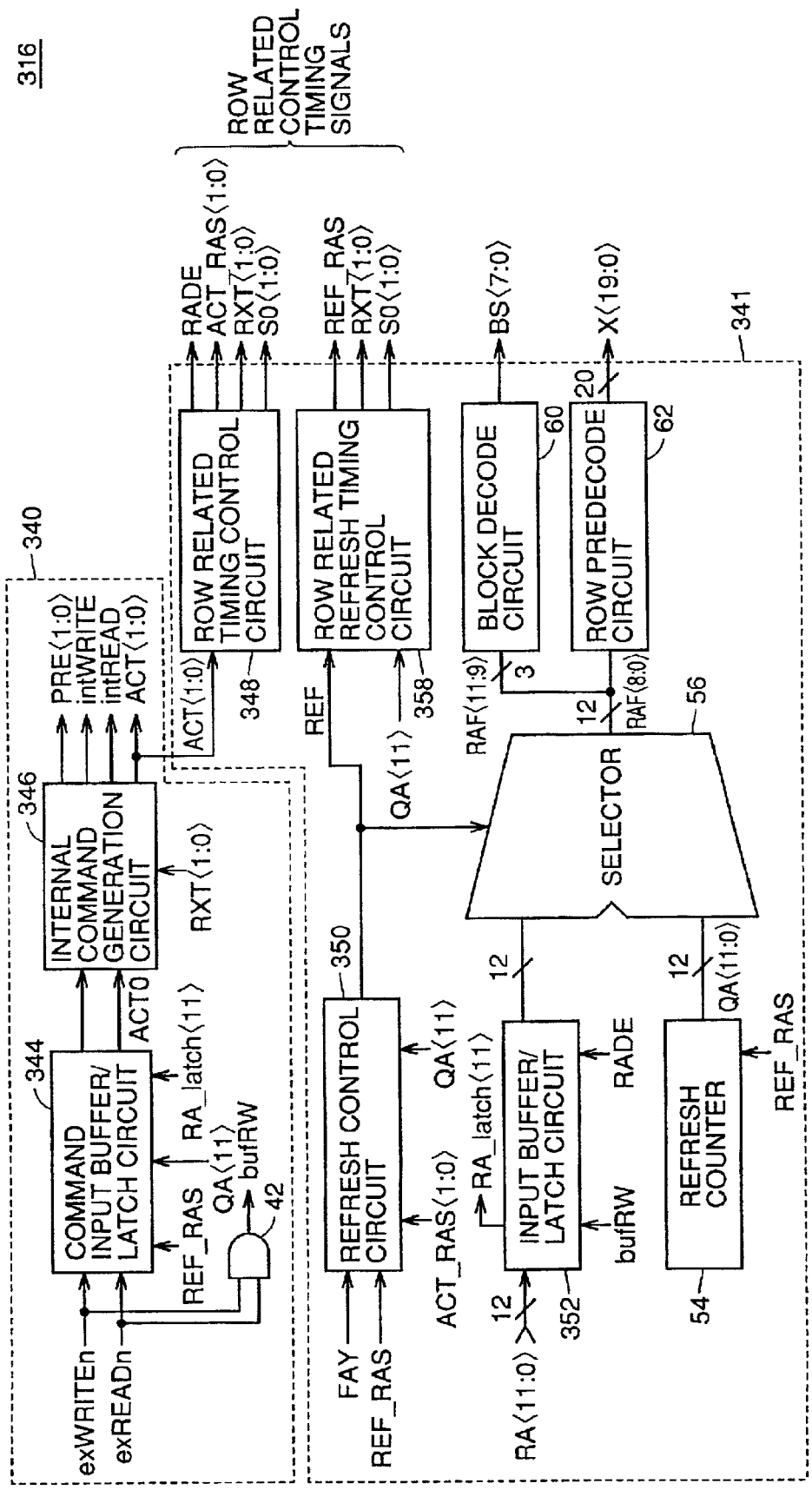
FIG. 22 is a block diagram showing a structure of a row selection related circuit/command generation related circuit 316 of FIG. 21.

FIG. 22 is a block diagram showing a structure of row selection related circuit/command generation related circuit 316 of FIG. 21.

Referring to FIG. 22, row selection related circuit/command generation related circuit 316 includes a command generation circuit 340 and a row selection control circuit 341.

Command generation circuit 340 differs from command generation circuit 40 in that a command input buffer/latch circuit 344 is provided instead of command input buffer/latch circuit 44 and an internal command generation circuit 346 is provided instead of internal command generation circuit 46 in the structure of command generation circuit 40 of FIG. 6. The remaining structure is similar to that of FIG. 6, and description thereof will not be repeated.

Command input buffer/latch circuit 344 differs in that a row active command signal ACT0 is transmitted to the internal command generation circuit according to refresh activation signal REF_RAS and the status of the most significant external row address RA_latch<11> when command signals exREADn and exWRITEn are input. Internal command generation circuit 346 differs in the structure of rendering internal command signals ACT<1:0> and PRE<1:0> active according to the state of word driver master signal RXT<1:0>.

Row selection control circuit 341 differs from row selection control circuit 41 of FIG. 6 in that a refresh control circuit 350 is provided instead of refresh control circuit 50, a row related timing control circuit 348 is provided instead of row related timing control circuit 48, and a row related refresh timing control circuit 358 is provided instead of row related refresh timing control circuit 58. The remaining structure is similar to that of row related control circuit 41 of FIG. 6, and description thereof will not be repeated.

In the example of the 2-bank structure shown in FIG. 22, the bank address is allocated to the most significant row address RA<11>. A row related control timing signal is applied corresponding to each bank such as a row active command signal ACT<1:0>, word line drive master signal RXT<1:0>, sense amplifier activation signal SO<1:0>, and internal precharge command signal PRE<1:0>.

Refresh control signal 350 generates an internal refresh command signal REF according to normal operation signal ACT_RAS and address QA<11:0> of each bank. Also, row related timing control circuit 348 and row related refresh timing control circuit 358 output row related control timing signals corresponding to each bank.

In the case where the bank corresponding to the normal operation of a read or write cycle is identical to the bank that is currently being refreshed or to be refreshed in the third embodiment, the DRAM core provides control so that either the normal operation or the refresh operation is deferred and carried out in the second cycle. Also, the DRAM core provides control so that the refresh operation is carried out after the normal operation carried out in the second cycle ends.

When the bank that is to be accessed in the normal operation differs from the bank that is currently being refreshed or to be refreshed, the read or write cycle time for execution can be shortened by providing control so that the normal operation and the refresh operation are carried out in parallel in the first cycle.

According to the structure shown in FIG. 22, when the first or second bank is currently being refreshed and refresh activation signal REF_RAS signal is activated and when the most significant bit address QA<11> of the refresh counter is identical to the most significant bit external row address RA_latch<11> that becomes the bank address in the case where external read command signal exREADn or external write command signal exWRITEn is applied, the second cycle is generated after the refresh operation ends and refresh activation signal REF_RAS is rendered inactive, as in the first embodiment. In the second cycle, row active command signal ACT<1> or ACT<0> is rendered active to enter the row active operation according to external row address RA_latch<11> to carry out a read or write operation.

If the most significant bit address QA<11> does not coincide with external row address RA_latch<11>, row active command signal ACT<1> or ACT<0> is rendered active to enter a row active operation. A read or write operation is carried out.

When the first or second bank is currently in a row active state in the case refresh request signal FAY is input, i.e. when normal operation signal ACT_RAS<0> or ACT_RAS<1> is activated, the second cycle is generated to enter the refresh operation mode after normal operation signal ACT_RAS<0> or ACT_RAS<1> is rendered inactive similar to the first embodiment if the bank specified by most significant bit address QA<11> that is to be refreshed coincides with the bank that is to be accessed in a normal operation. In the case where these banks do not coincide with each other, the device enters the refresh operation.

Figure 23:
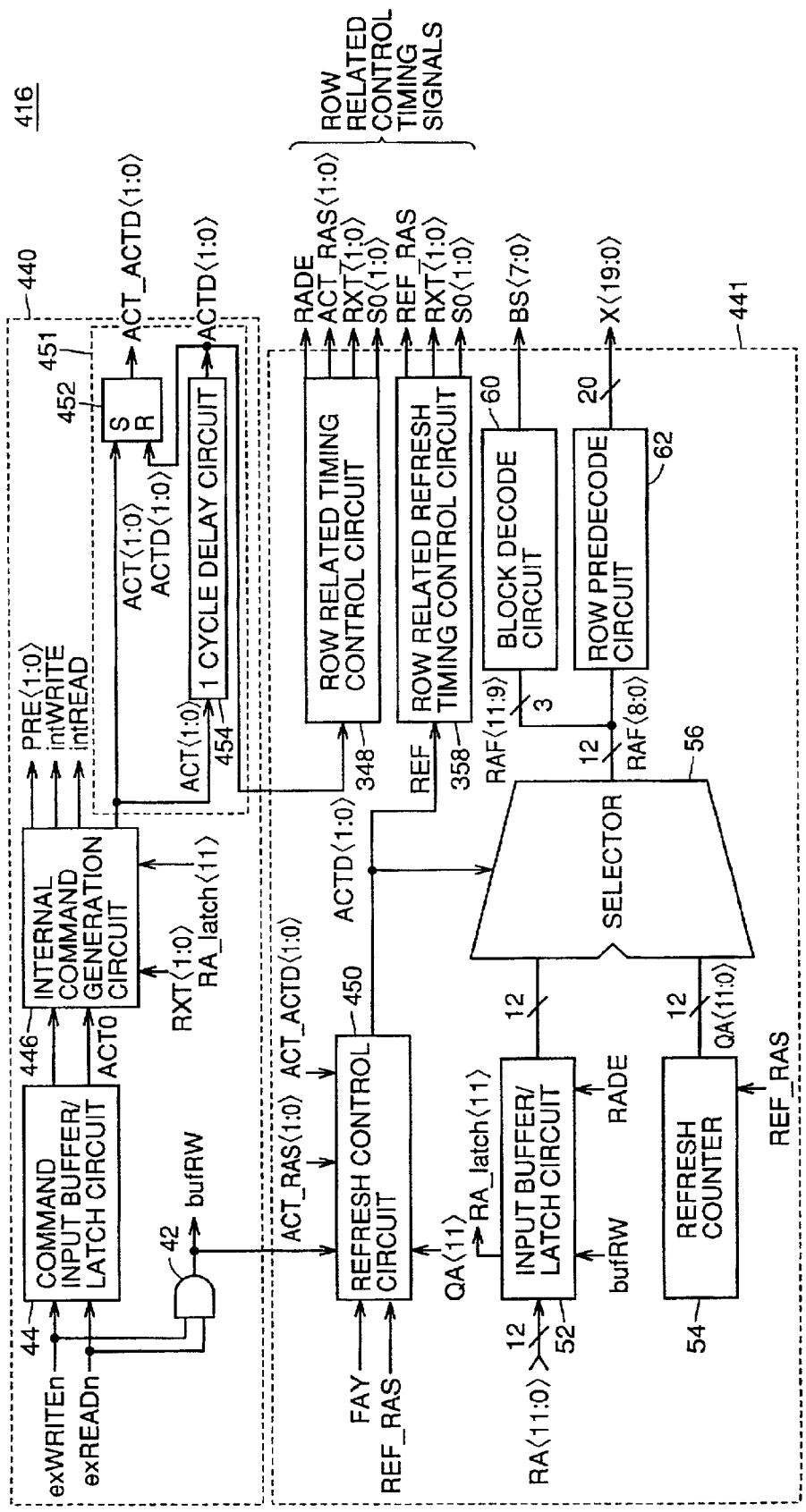
FIG. 23 is a block diagram showing another example of a row selection related circuit/command generation related circuit when in a 2-bank structure.

FIG. 23 is a block diagram showing another example of a row selection related circuit/command generation related circuit in the 2-bank structure.

When an external read command signal exREADn or external write command signal exWRITEn is input according to the structure shown in FIG. 23, the device enters the row active operation from the second cycle delayed always by the first cycle of time corresponding to the delay time of one cycle delay circuit 454 in delay circuit 451, as in the second embodiment.

When the bank specified by the most significant bit address QA<11> that is to be refreshed matches the bank that is to carry out or currently carrying out the normal operation of read or write identified by delay time display signal ACT_ACTD<1:0> and normal signal ACT_RAS<1:0> in the case refresh request signal FAY is input, control is provided of a refresh operation initiation timing similar to that of the second embodiment.

If the bank that is to be refreshed does not coincide with the bank that is to carry out a normal operation, the device directly enters a refresh operation.

Thus, a DRAM core that is operable with an interface similar to that of an SRAM can be realized even in the bank structure.

The above description has been provided corresponding to the case where a refresh operation and a normal access operation contend. The circuit configuration realizing the same can include a latch circuit holding a row predecoded signal X<19:0> in the row local control block of each bank.

In this case, control is provided so that the activation timing of row address enable signal RADE and internal refresh command signal REF is shifted by at least predetermined time so that they will not be rendered active simultaneously. By this control, an operation can be realized in the present invention such that row predecoded signal X<19:0> in a read or write operation does not conflict with row predecoded signal X<19:0> in a refresh operation.

In this case, following the input of row predecoded signal X<19:0> to the row local control block selected by block select signal BS<7:0>, the signal line bus through which row predecoded signal X<19:0> is transmitted to the row local control block can be made available. Since the bus of the row predecoded signal can be shared between banks, the chip area can be reduced.

Fourth Embodiment

A semiconductor memory device according to a fourth embodiment of the present invention is directed to the case where external command input buffer/latch circuit 44 and input buffer/latch circuit 52 receiving external row address RA<11:0> shown in FIG. 6 have a synchronous type interface.

Figure 24:
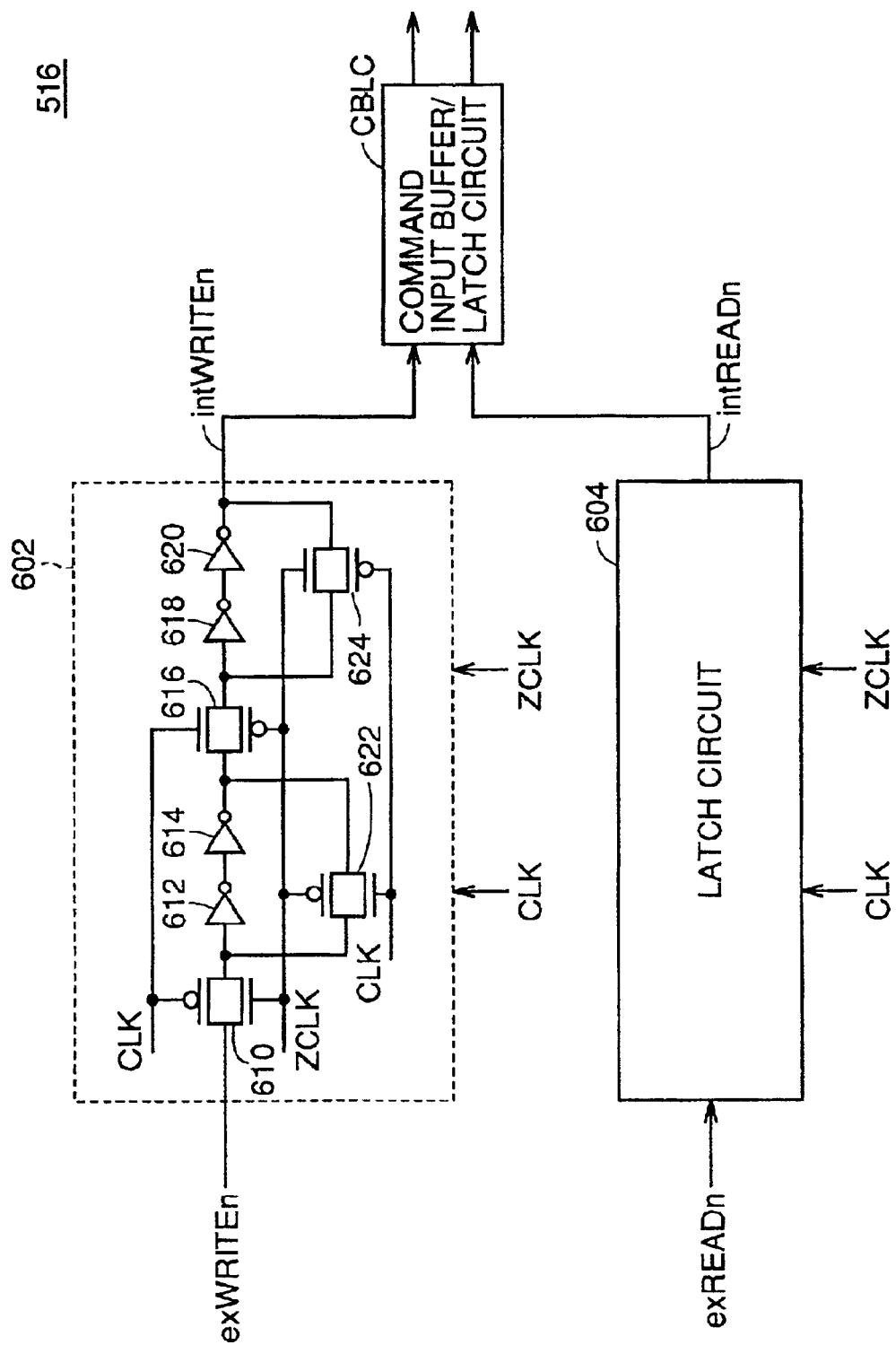
FIG. 24 is a circuit diagram to describe a synchronous type interface employed in a fourth embodiment.

FIG. 24 is a circuit diagram to describe the synchronous type interface employed in the fourth embodiment.

Referring to FIG. 24, a latch circuit 602 receiving an external write command signal exWRITEn according to clock signals CLK and ZCLK and a latch circuit 604 receiving an external read command signal exREADn in synchronization with clock signals CLK and ZCLK are provided at the preceding stage of command input buffer/latch circuit CBLC. For example, when the semiconductor memory device of the first embodiment is to be synchronized, command input buffer/latch circuit 44 of FIG. 6 corresponds to command input buffer/latch circuit CBLC of FIG. 24.

Latch circuit 602 provides an internal read command signal intWRITEn towards command input buffer/latch circuit CBLC. Latch circuit 604 provide an internal read command signal intREADn towards command input buffer/latch circuit CBLC.

Latch circuit 602 includes a transmission gate 610 receiving and transmitting internally external write command signal exWRITEn according to clock signals CLK and ZCLK, inverters 612 and 614 connected in series to receive external write command signal exWRITEn input by transmission gate 610, a transmission gate 622 rendered conductive complementary to transmission gate 610 to feed back the output of inverter 614 to the input of inverter 612, a transmission gate 616 receiving the output of inverter 614 and rendered conductive to transmit the same according to clock signals CLK and ZCLK, inverters 618 and 620 connected in series to receive the data transmitted by transmission gate 616, and a transmission gate 624 rendered conductive complementary to transmission gate 616 to feed back the output of inverter 620 to the input of inverter 618.

The output of inverter 620 is the output of latch circuit 602, corresponding to internal write command signal intWRITEn.

Latch circuit 604 has a structure similar to that of latch circuit 602. Therefore, description thereof will not be repeated.

Figure 25:
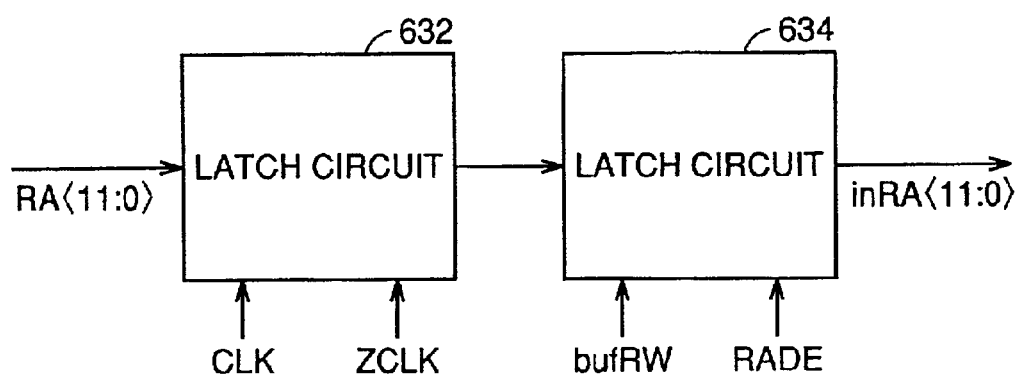
FIG. 25 is a block diagram showing a structure of an input buffer/latch circuit 552 to input an external row address in synchronization with a clock signal in the fourth embodiment.

FIG. 25 is a block diagram showing a structure of input buffer/latch circuit 552 to input an external row address in synchronization with the clock signal in the fourth embodiment.

Referring to FIG. 25, input buffer/latch circuit 552 includes a latch circuit 632 receiving external row address signal RA<11:0> in synchronization with clock signals CLK and ZCLK, and a latch circuit 634 receiving the output of latch circuit 632 according to a signal bufRW and a row address enable signal RADE to output an internal row address signal inRA<11:0>.

Input buffer/latch circuit 552 shown in FIG. 25 is employed instead of input buffer/latch circuit 52 shown in FIG. 6. The structure of latch circuit 634 is similar to that of input buffer/latch circuit 52 shown in FIG. 6. Therefore, description thereof will not be repeated. Also, description of the structure of latch circuit 632 will not be repeated since it is similar to that of latch circuit 602 shown in FIG. 24.

The fourth embodiment is added with the interface that receives external read command signal exREADn and external write command signal exWRITEn of the semiconductor memory device described in the first embodiment and also an external row address signal RA<11:0> in synchronization with a clock signal. Therefore, a DRAM core block for embedding that does not require a complicated control signal for refresh control can be realized even in the case where a synchronous semiconductor memory device is incorporated as a DRAM core.

The structure described in the previous second and third embodiments can be applied to a synchronous type semiconductor memory device by adding a similar synchronous type interface.

The first to fourth embodiments correspond to a structure generating an internal refresh command signal REF using a refresh request signal FAY directly or delayed. However, a structure may be implemented in which an internal refresh command signal REF is rendered active unconditionally when entering a read or write cycle.

In this case, internal refresh command signal REF generated unconditionally according to a command is rendered invalid when currently in a refresh operation by a refresh request signal FAY. In the case refresh is carried out according to an internal refresh command signal REF generated unconditionally in a read or write cycle, control described in the first to fourth embodiments is to be carried out.

Fifth Embodiment

For a system LSI, a one chip LSI is implemented with the combination of a logic of high complexity and a DRAM core as shown in FIG. 1. Logic LG of high circuit complexity often has various circuits embedded according to the user's specification. There is a case where the address signal applied from the logic of high circuit complexity to the DRAM core temporarily exhibits an unexpected change. It is desirable that the DRAM core does not operate erroneously with respect to such changes in the address signal caused by noise.

FIG. 26 is a block diagram showing a structure of a row selection related circuit/command generation related circuit 600 employed in the fifth embodiment.

Row selection related circuit/command generation related circuit 600 is used instead of row selection related circuit/command generation related circuit 16 of FIG. 6. Referring to FIG. 26, row selection related circuit/command generation related circuit 600 includes a row selection control circuit 602 instead of row selection control circuit 41 in the structure of row selection related circuit/command generation related circuit 16.

Row selection control circuit 602 differs from row selection control circuit 41 in that an input buffer/latch circuit 604 and a row related timing control circuit 606 are provided instead of input buffer/latch circuit 52 and row related timing control circuit 48, respectively.

Input buffer/latch circuit 604 accepts row address signal RA<11:0> according to signal bufRW and row address enable signal RADE to provide the same as row address signal RA_LAT1<11:0> to selector 56, and generates and provides to row related timing control circuit 606 a control signal P.

The remaining structure is similar to that of row selection related circuit/command generation related circuit 16 of FIG. 6. Therefore, description thereof will not be repeated.

Figure 27:
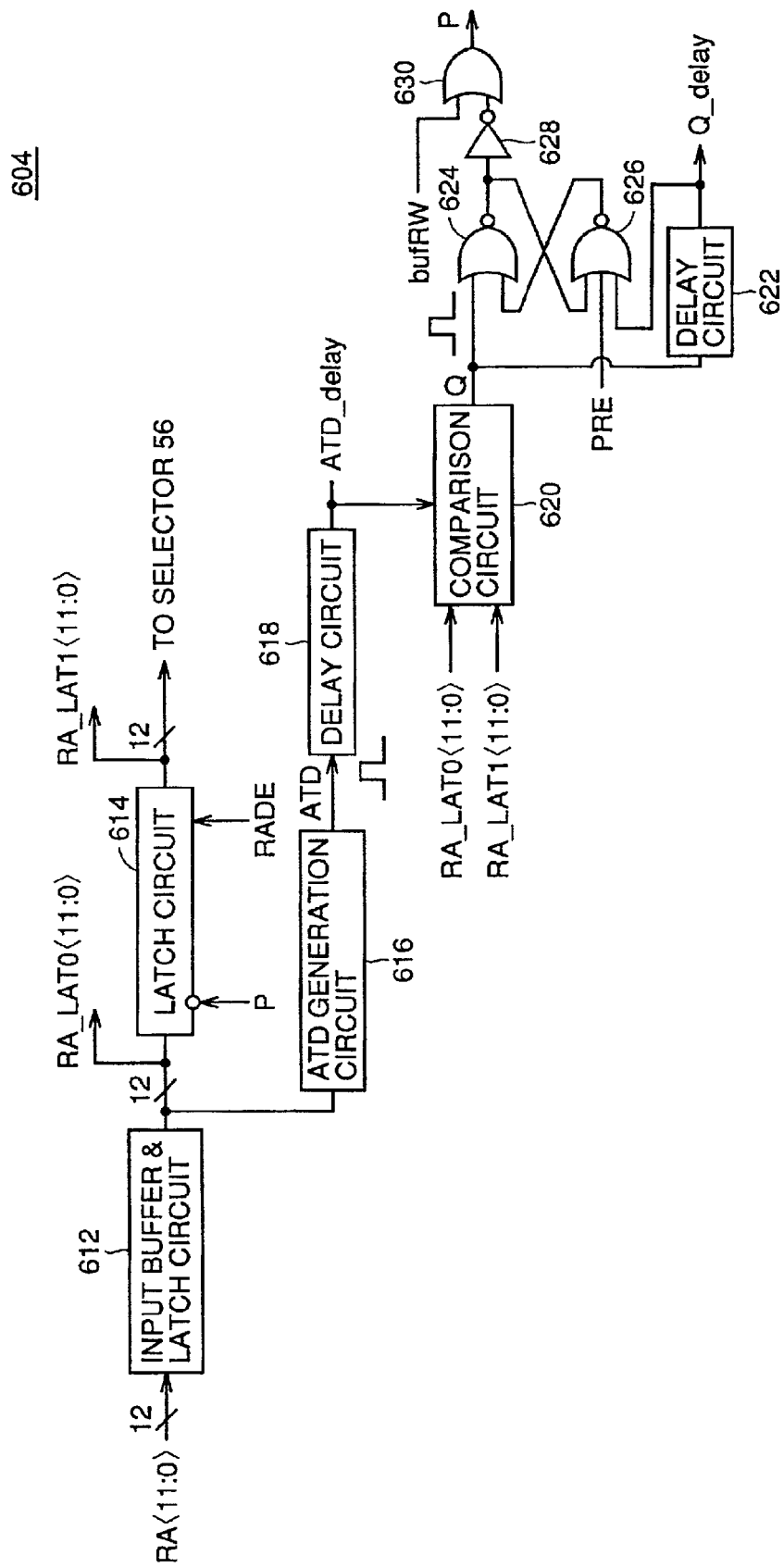
FIG. 27 is a circuit diagram of the structure of an input buffer/latch circuit 604 of FIG. 26.

FIG. 27 is a circuit diagram showing a structure of input buffer/latch circuit 604 of FIG. 26.

Referring to FIG. 27, input buffer/latch circuit 604 includes an input buffer & latch circuit 612 latching row address RA<11:0> to output a signal RA_LAT0<11:0>, and a latch circuit 614 accepting and retaining signal RA_LAT0<11:0> according to control signal P and row address enable signal RADE to output signal RA_LAT<11:0>. Signal RA_LAT1<11:0> is applied to selector 56 of FIG. 26.

Input buffer/latch circuit 604 further includes an ATD generation circuit 616 detecting change in signal RA_LAT0<11:0> to output a detection signal ATD, a delay circuit 618 delaying detection signal ATD to output a signal ATD_delay, and a comparison circuit 620 rendered active in response to signal ATD_delay to compare signal RA_LAT0<11:0> with signal RA_LAT1<11:0>. Comparison circuit 620 outputs a control signal Q.

Control signal Q is at an L level when comparison circuit 620 is in an inactive state. When comparison circuit 620 is rendered active to carry out a comparison operation and signal RA_LAT0<11:0> matches signal RA_LAT1<11:0>, control signal Q remains at the L level. When the signals do not match, control signal Q is rendered active to an H level in a pulsive manner for a predetermined time.

Input buffer/latch circuit 604 further includes a delay circuit 622 delaying control signal Q to output a signal Q_delay, a 3-input NOR circuit 626 receiving signals Q delay and PRE at the first and second inputs, respectively, and a NOR circuit 624 receiving control signal Q and the output of NOR circuit 626. The output of NOR circuit 624 is applied to the third input of NOR circuit 626.

Input buffer/latch circuit 604 further includes an inverter 628 receiving and inverting the output of NOR circuit 624, and an OR circuit 630 receiving the output of inverter 628 and signal bufRW to output a control signal P.

FIG. 28 is a circuit diagram showing an example of a structure of input buffer & latch circuit 612 and latch circuit 614 of FIG. 27.

Referring to FIG. 28, input buffer & latch circuit 612 includes an inverter 712 receiving and inverting row address signal RA<11:0>, an inverter 714 receiving and inverting the output of inverter 712 to output a signal RA_LAT0<11:0>, and an inverter 716 receiving the output of inverter 714 to feed back the inverted signal to the input of inverter 714.

Latch circuit 614 includes an inverter 722 receiving and inverting control signal P, a transmission gate 724 rendered conductive in response to control signal P and the output of inverter 722 to transmit signal RA_LAT0<11:0>, an inverter 726 receiving and inverting signal RA_LAT0<11:0> transmitted by transmission gate 724, and an inverter 728 receiving and inverting the output of inverter 726 to feed back the inverted signal to the input of inverter 726.

Latch circuit 614 further includes an inverter 730 receiving and inverting row address enable signal RADE, a transmission gate 732 rendered conductive in response to row address enable signal RADE and the output of inverter 730 to transmit the output of inverter 726, an inverter 734 receiving and inverting the output of inverter 726 transmitted by transmission gate 732 to output a signal RA_LAT0<11:0>, and an inverter 736 receiving and inverting the output of inverter 734 to feed back the inverted signal to the input of inverter 734.

Figure 29:
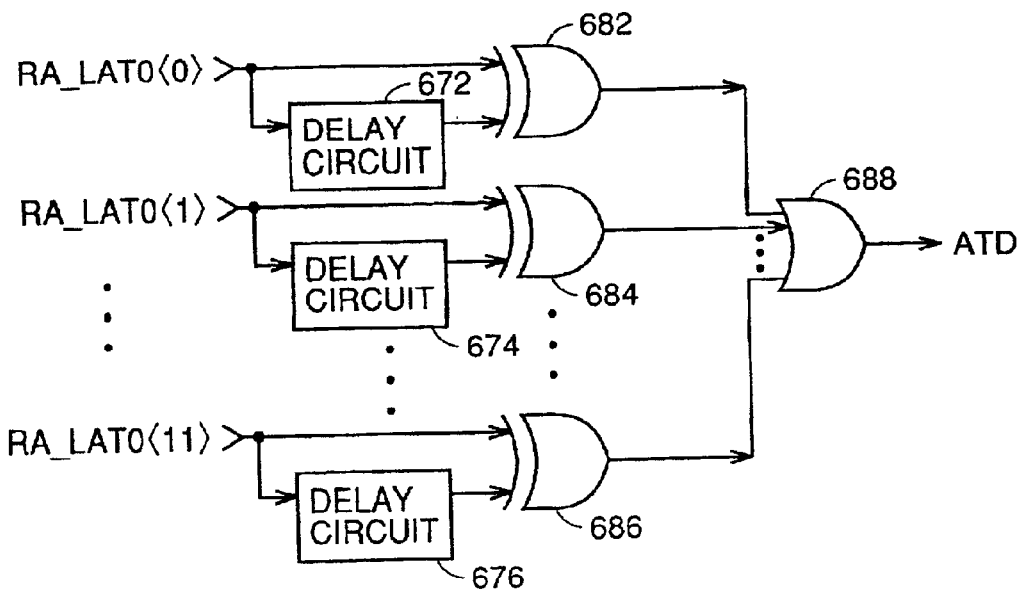
FIG. 29 is a circuit diagram showing an example of a structure of an ATD circuit 616 of FIG. 27.

FIG. 29 is a circuit diagram showing an example of the structure of ATD circuit 616 of FIG. 27.

Referring to FIG. 29, ATD circuit 616 includes delay circuits 672–676 receiving and delaying signals RA_LAT0<0> to RA_LAT0<11>, respectively, EXOR circuits 682–686 receiving signals RA_LAT0<0> to RA_LAT0<11> and the outputs of delay circuits 672–676, respectively, and an OR circuit 688 receiving the outputs of EXOR circuits 682–686 to output a detection signal ATD.

The output of delay circuit 672 is equal to signal RA_LAT0<0> when signal RA_LAT0<0> does not change for a predetermined time. Therefore, the output of EXOR circuit 682 attains an L level. When signal RA_LAT0<0>changes, the signals applied to EXOR circuit 682 will be inconsistent each other for the delay time of delay circuit 672. Therefore, EXOR circuit 682 outputs a pulse having a width corresponding to the delay time thereof.

Change is similarly detected for other address signal bits RA_LAT0<1> to RA_LAT0<11>. A pulse is output by OR circuit 688 as detection signal ATD when any address bit changes.

Figure 30:
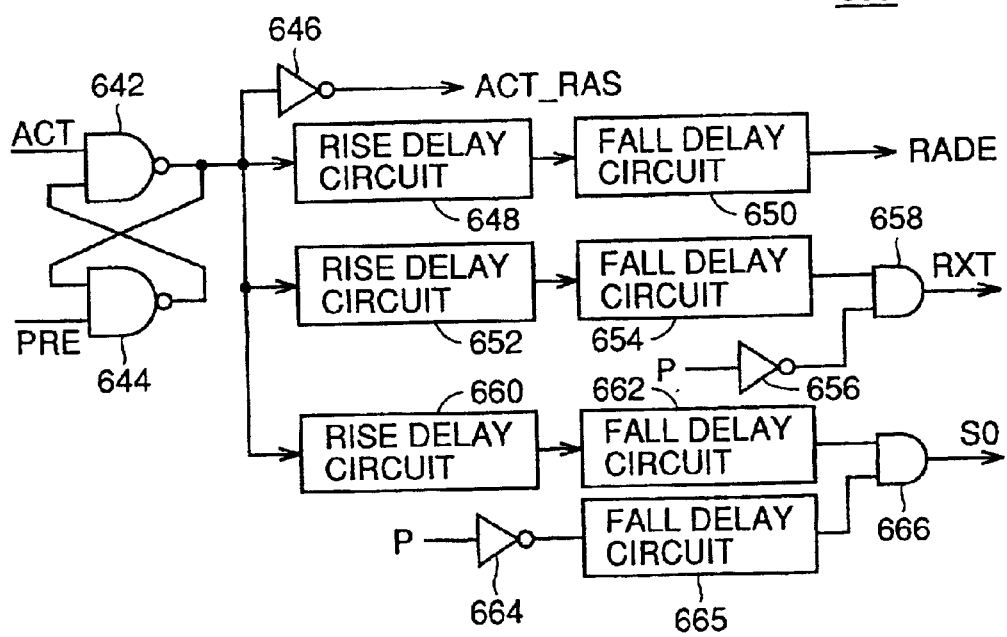
FIG. 30 is a circuit diagram showing a structure of a row related timing control circuit 606 of FIG. 26.

FIG. 30 is a circuit diagram showing a structure of row related timing control circuit 606 of FIG. 26.

Referring to FIG. 30, row related timing control circuit 606 includes NAND circuits 642 and 644 receiving signals ACT and PRE at respective inputs, and having their outputs cross-coupled to the other input, an inverter 646 receiving and inverting the output of NAND circuit 642 to output signal ACT_RAS, a rise delay circuit 648 receiving the output of NAND circuit 642 to delay the rising edge of the input waveform, and a fall delay circuit 650 receiving the output of rise delay circuit 648 to delay the falling edge of the input waveform. Fall delay circuit 650 outputs a row address enable signal RADE.

Row related timing control circuit 606 further includes a rise delay circuit 652 receiving the output of NAND circuit 642 to delay the rising edge of the input waveform, a fall delay circuit 654 receiving the output of rise delay circuit 652 to delay the falling edge of the input waveform, an inverter 656 receiving and inverting control signal P, and an AND circuit 658 receiving the outputs of inverter 656 and fall delay circuit 654 to output a word line drive timing signal RXT.

Row related timing control circuit 606 further includes a rise delay circuit 660 receiving the output of NAND circuit 642 to delay the rising edge of the input waveform, a fall delay circuit 662 receiving the output of rise delay circuit 660 to delay the falling edge of the input waveform, an inverter 664 receiving and inverting control signal P, a fall delay circuit 665 delaying the falling edge of the output waveform of inverter 664, and an AND circuit 666 receiving the outputs of fall delay circuit 665 and fall delay circuit 662 to output a sense amplifier activation signal SO.

Figure 31:
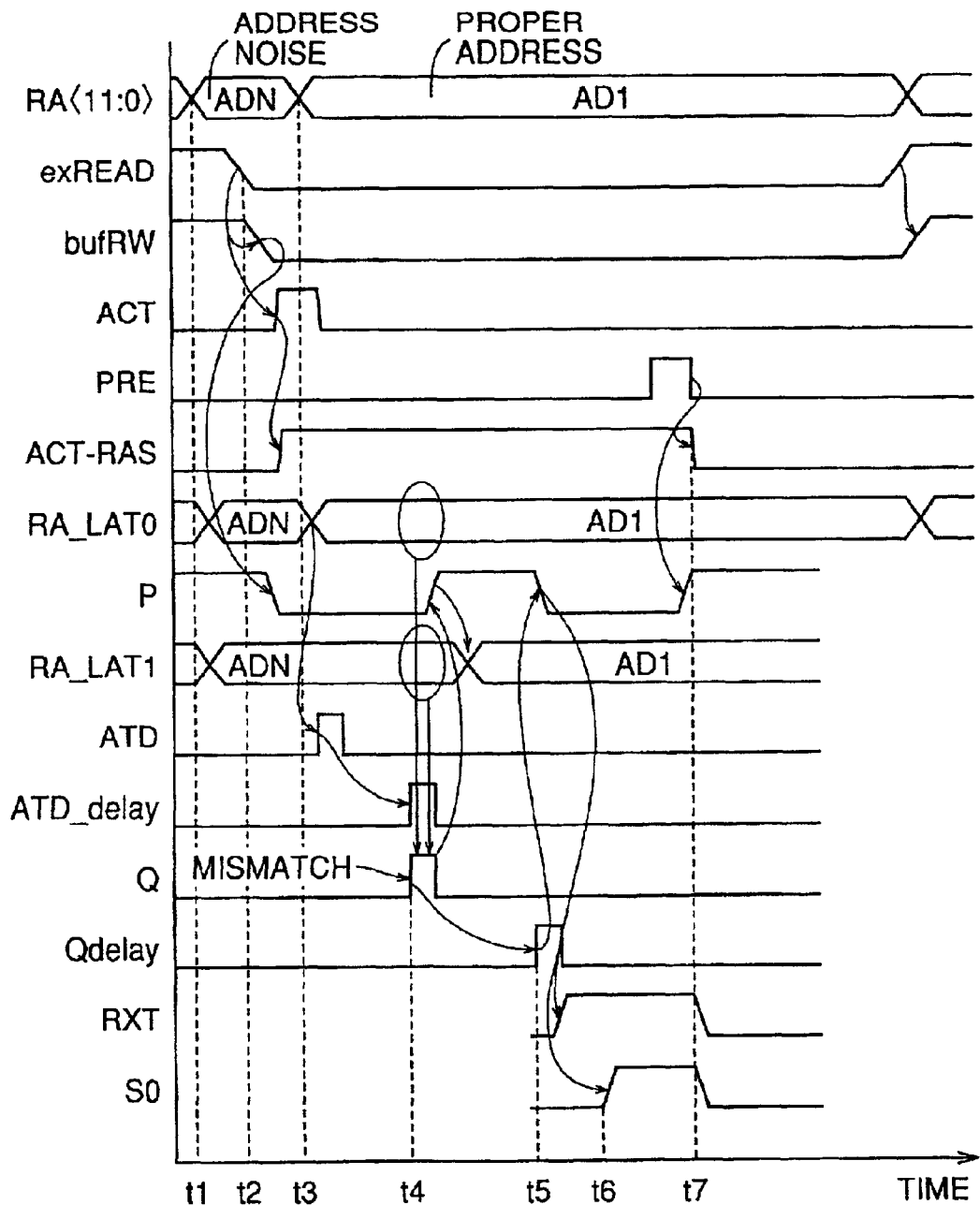
FIG. 31 is an operation waveform diagram representing an operation of a row selection related circuit/command generation related circuit 600.

FIG. 31 is an operation waveform diagram to describe the operation of row selection related circuit/command generation related circuit 600.

Referring to FIGS. 26 and 31, address noise AND appears in row address signal RA<11:0> at time t1. When command signal exREAD is input at time t2, signal bufRW output from the AND circuit of FIG. 21 is rendered active to an L level. In response, control signal P output from the OR circuit of FIG. 27 is pulled down to an L level, whereby transmission gate 724 in FIG. 28 is closed. Therefore, latch circuit 614 latches address noise AND.

At time t3, proper address data AD1 is applied from the logic as row address signal RA<11:0>. Address data AD1 is transmitted to the output of address latch 612. In other words, address data AD1 is output as signal RA_LAT0<11:0>.

A one shot pulse appears in signal ATD in response to the change in signal RA_LAT0<11:0>. Transmission gate 724 at the input portion of latch 614 is closed since control signal P is at an L level. Therefore, address noise AND is output as signal RA_LAT1<11:0>.

When the pulse of signal ATD is delayed and a pulse appears in signal ATD_delay at time t4, signal RA_LAT0<11:0> is compared with signal RA_LAT1<11:0> by comparison circuit 620 of FIG. 27. Since signal RA_LAT0<11:0> is address data AD1 and signal RA_LAT1<11:0> is address noise AND, resultant signal Q of the comparison is rendered active. Then, control signal P is pulled up again to an H level in response to the change of signal Q, whereby latch 614 accepts data. In other words, signal RA_LAT1<11:0> changes to address signal AD1.

When there is a pulse in delay signal Q_delay of signal Q at time t5, control signal P is pulled down again to an L level, whereby the data of latch 614 is ascertained. In response to the fall of control signal P, word line drive timing signal RXT is rendered active by AND circuit 658 of FIG. 30. Sense amplifier activation signal SO is also rendered active at time t6 which is the output of AND circuit 658, having its rise delayed by fall delay circuit 665.

During time t4–t5, i.e. the period of time determined by delay circuit 662, control signal P is at an H level. This period of time maintaining the H level is used to delay the activation timing of word line drive timing signal RXT and sense amplifier activation signal SO until block select signal BS<7:0> and predecoded signal X<19:0> are processed in the sub block. These block select signal BS<7:0> and predecoded signal X<19:0> are generated from the proper internal address AD1.

At time t7, normal operation signal ACT_RAS, word line drive timing signal RXT and sense amplifier activation signal SO are pulled down to an L level in response to signal PRE.

According to the above-described structure of the fifth embodiment, when the address taken in response to the input of a read/write command applied from an external source of the DRAM core corresponds to an address change caused by noise and the proper address is input thereafter, the address change is recognized and access is carried out according to the proper address.

Sixth Embodiment

Figure 32:
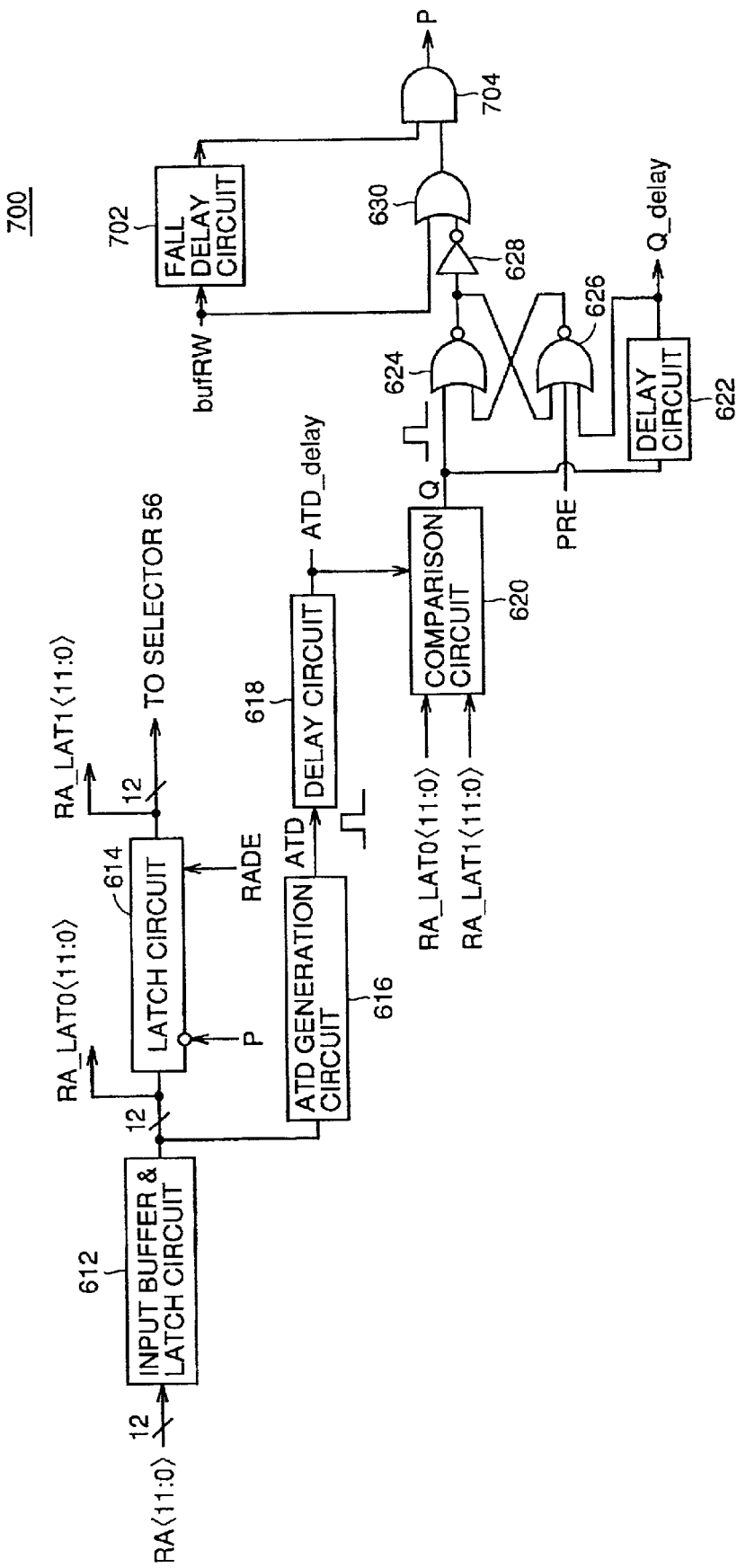
FIG. 32 is a circuit diagram showing a structure of an input buffer/latch circuit 700 employed in a sixth embodiment of the present invention.

FIG. 32 is a circuit diagram showing a structure of an input buffer/latch circuit 700 employed in a sixth embodiment of the present invention.

Referring to FIG. 32, input buffer/latch circuit 700 includes, in addition to the structure of input buffer/latch circuit 604 of FIG. 27, a fall delay circuit 702 delaying the fall of the waveform of signal bufRW, and an AND circuit 704 receiving the outputs of fall delay circuit 702 and OR circuit 630. AND circuit 704 outputs a control signal P. The remaining structure is similar to that of input buffer/latch circuit 604. Therefore, description thereof will not be repeated.

Figure 33:
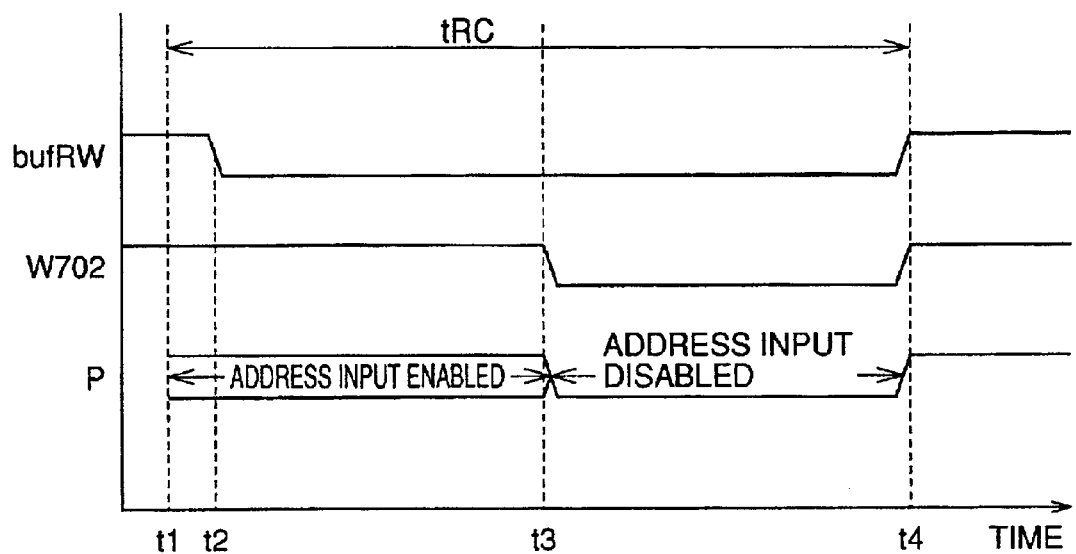
FIG. 33 is an operation waveform diagram to describe briefly the operation of input buffer/latch circuit 700.
Figure 34:
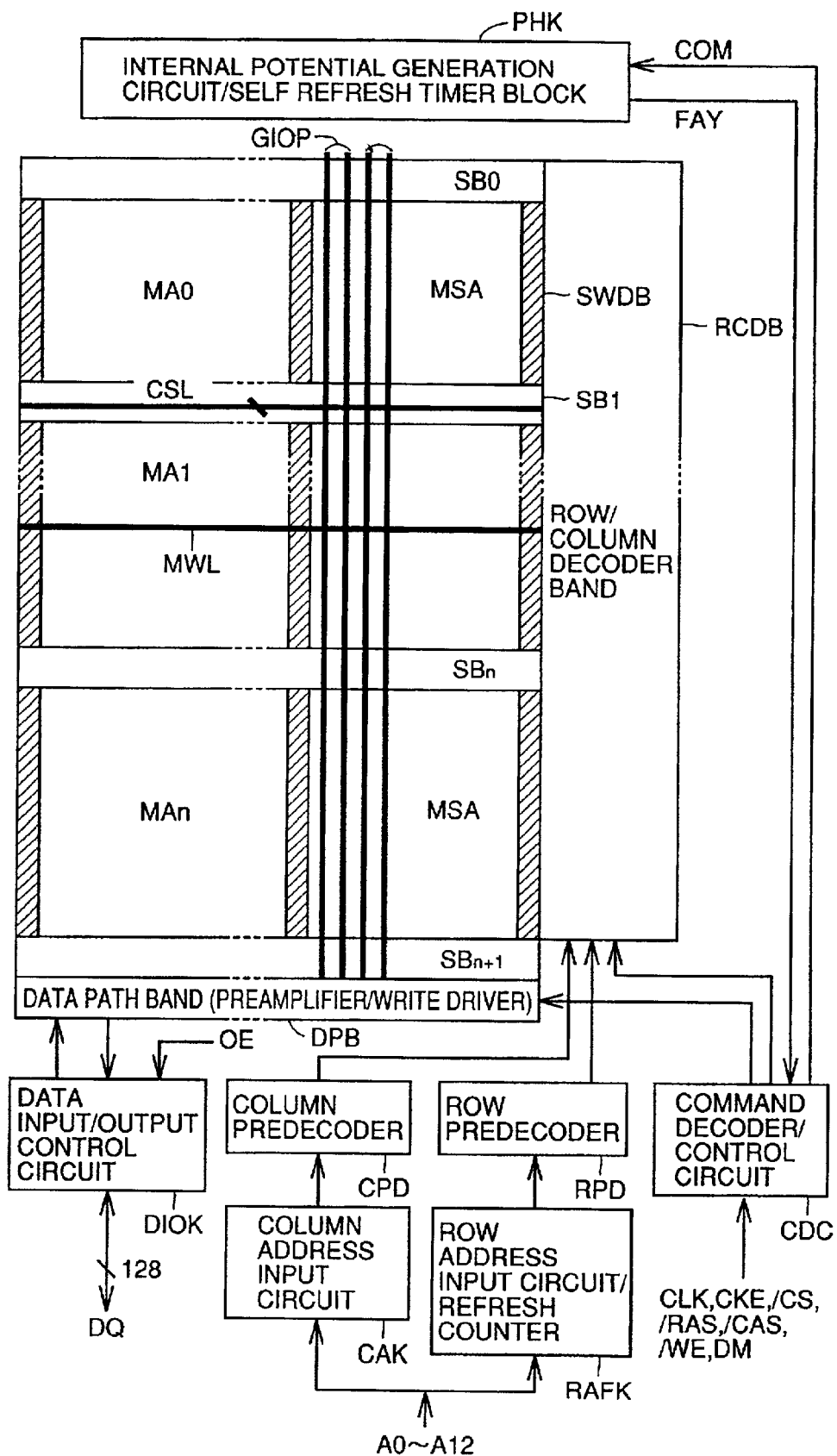
FIG. 34 schematically shows a structure of a DRAM circuit block incorporated in a conventional system LSI.

FIG. 33 is an operation waveform diagram to describe briefly the operation of input buffer/latch circuit 700.

Referring to FIGS. 32 and 33, the address access cycle is initiated from time t1. In response to the command signal at time t2, signal bufRW changes, whereby the address is latched. In the case where the proper address is input thereafter, the proper address will be latched, as described previously with reference to FIG. 31.

At time t3, the fall of signal bufRW is delayed by fall delay circuit 702. The output waveform of fall delay circuit 702 is represented as waveform W702. Since this waveform W702 is applied to AND circuit 704, control signal P is fixed at the L level between time t3–t4. A new address will not be accepted at latch circuit 614 even if there is a change in row address RA<11:0> during this period.

In other words, data readout cannot be ended within a predetermined read cycle period even if address change is detected after time t3. By rendering the address change at time t3 onward invalid, the operation is stabilized.

Referring to FIGS. 30 and 32 again, detection of address change causes comparison circuit 620 to carry out a comparison operation at an elapse of a predetermined time defined by delay circuit 618. Then, control signal P exhibits transition at an elapse of a predetermined time defined by delay circuit 622. Therefore, the output of latch circuit 614 is ascertained.

When there is address change after the elapse of the predetermined time defined by fall delay circuit 702 after command input, control signal Q will not affect control signal P by virtue of AND circuit 704. Even if control signal P attains an H level in response to the comparison result after detection of address change, the control signal P is pulled down to an L level at an elapse of the predetermined time defined by fall control circuit 702 before the elapse of the delay time of delay circuit 622, and the address held in latch circuit 614 is ascertained. Then, word line activation or the like is carried out at time t3 onward of FIG. 33.

In addition to the effect of the fifth embodiment, the address change after the elapse of a predetermined time from the input of a read/write command is rendered invalid to stabilize the operation. This predetermined time is defined by the delay time of fall delay circuit 702 of FIG. 32. The delay time of fall delay circuit 702 is set according to the difference between the cycle time defined by the product and the effective value of the cycle time of the row address access of the memory array.

For example, when an operation of two cycles is allowed for the DRAM with respect to the product standard of 70 ns of a low speed SRAM, the delay time of fall delay circuit 702 is set half the value of read cycle time tRC of the product standard.

The above description has been provided for an embedded DRAM. However, the present invention is generally applicable to any DRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a memory array including a plurality of memory cells arranged in a matrix;
    a refresh timer circuit providing a refresh request signal at a time interval required to refresh data held by said plurality of memory cells;
    a command generation circuit generating an internal command signal in response to an access command; and
    a row selection control circuit carrying out an operation associated with row selection of said memory array, said row selection control circuit including:
        a timing control circuit rendered active in response to said internal command signal to output a timing signal of a row selection operation of said memory cell;
        a refresh control circuit receiving and holding said refresh request signal to output an internal refresh command signal when said timing control circuit attains an inactive state; and
        a refresh timing control circuit rendered active in response to said internal refresh command signal to output said timing signal instead of said timing control circuit; and
    a row selection circuit carrying out row selection of said memory cell in response to said timing signal.

2. The semiconductor memory device according to claim 1, wherein said access command includes a read out command,
    wherein a basic cycle time starting from reception of said access command by said semiconductor memory device up to reception of the next access command is at least a total time of a normal read out cycle time starting from output of said internal command signal up to completion of data read out from said memory array and a refresh cycle time starting from output of said internal refresh command signal up to completion of refresh of a portion in said memory array corresponding to said internal refresh command signal.

3. The semiconductor memory device according to claim 2, wherein said refresh control circuit comprises
    a latch circuit receiving and holding said refresh request signal, and
    a pulse generation circuit providing a pulse that becomes a basis of said internal command signal when an output of said latch circuit indicates input of said refresh request signal and said timing control circuit is rendered inactive.

4. The semiconductor memory device according to claim 2, wherein said command generation circuit holds said access command, and waits for inactivation of said refresh timing control circuit to output said internal command signal when said refresh timing control circuit is active.

5. The semiconductor memory device according to claim 4, wherein said command generation circuit comprises
    a latch circuit receiving and holding said access command, and
    a pulse generation circuit providing a pulse that becomes a basis of said internal command signal when an output of said latch circuit indicates input of said access command and when said refresh timing control circuit is rendered inactive.

6. The semiconductor memory device according to claim 2, wherein said command generation circuit comprises
    an internal command generation circuit providing a command generation reference signal in response to said access command, and
    a delay circuit delaying said command generation reference signal for at least said refresh cycle time and providing said internal command signal,
    wherein said refresh control circuit receives and holds said refresh request signal to output said internal refresh command signal when said timing control circuit attains an inactive state.

7. The semiconductor memory device according to claim 6, wherein said refresh control circuit comprises
    a latch circuit holding said refresh request signal, and
    a pulse generation circuit providing a pulse that becomes a basis of said internal refresh command signal when an output of said latch circuit indicates input of said refresh request signal and when said timing control circuit attains an inactive state.

8. The semiconductor memory device according to 2, further comprising a data input/output control circuit receiving and holding as read out data the output from said memory array, and receiving an output enable signal to output said read out data.

9. The semiconductor memory device according to claim 2, wherein said row selection control circuit further comprises
an address latch circuit holding an applied row address to output a normal row address,
a refresh counter circuit sequentially updating and providing a refresh row address corresponding to a row to be refreshed, and
a select circuit receiving said normal row address and said refresh row address to output one of said normal row address and said refresh row address as an address corresponding to row selection of said memory array in response to said internal refresh command signal.

10. The semiconductor memory device according to claim 9, wherein said memory array includes a plurality of banks that allows a row select operation independently,
wherein said refresh control circuit outputs said internal refresh command signal after said refresh control circuit is rendered inactive when a bank indicated by said normal row address coincides with a bank indicated by said refresh row address.

11. The semiconductor memory device according to claim 9, wherein said address latch circuit accepts said applied row address in synchronization with a clock signal.

12. The semiconductor memory device according to claim 2, further comprising a latch circuit accepting said access command in synchronization with a clock signal and providing said access command to said command generation circuit.

* * * * *